US009614109B2

(12) United States Patent
Yamamura et al.

(10) Patent No.: US 9,614,109 B2
(45) Date of Patent: Apr. 4, 2017

(54) PHOTODIODE AND PHOTODIODE ARRAY

(71) Applicant: HAMAMATSU PHOTONICS K.K., Hamamatsu-shi, Shizuoka (JP)

(72) Inventors: Kazuhisa Yamamura, Hamamatsu (JP); Akira Sakamoto, Hamamatsu (JP); Terumasa Nagano, Hamamatsu (JP); Yoshitaka Ishikawa, Hamamatsu (JP); Satoshi Kawai, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 14/683,524

(22) Filed: Apr. 10, 2015

(65) Prior Publication Data
US 2015/0214395 A1 Jul. 30, 2015

Related U.S. Application Data

(63) Continuation of application No. 13/202,244, filed as application No. PCT/JP2010/052197 on Feb. 15, 2010, now Pat. No. 9,190,551.

(30) Foreign Application Priority Data

Feb. 24, 2009 (JP) .................................. 2009-041078
Jun. 5, 2009 (JP) .................................. 2009-136426

(51) Int. Cl.
*H01L 31/062* (2012.01)
*H01L 31/0236* (2006.01)
(Continued)

(52) U.S. Cl.
CPC .... *H01L 31/02366* (2013.01); *H01L 27/1446* (2013.01); *H01L 27/1464* (2013.01);
(Continued)

(58) Field of Classification Search
CPC ............... H01L 31/103; H01L 31/0236; H01L 31/0232; H01L 27/14609
(Continued)

(56) References Cited

U.S. PATENT DOCUMENTS 4,072,541 A 2/1978 Meulenberg, Jr. et al.
4,277,793 A 7/1981 Webb
(Continued)

FOREIGN PATENT DOCUMENTS

CN 86108413 8/1987
CN 1227419 9/1999
(Continued)

OTHER PUBLICATIONS

Office Action dated Aug. 7, 2012 that issued in U.S. Appl. No. 13/143,765 including Double Patenting rejection at pp. 2-4.
(Continued)

*Primary Examiner* — Tran Tran
(74) *Attorney, Agent, or Firm* — Drinker Biddle & Reath LLP

(57) ABSTRACT

A p⁻ type semiconductor substrate 20 has a first principal surface 20*a* and a second principal surface 20*b* opposed to each other and includes a photosensitive region 21. The photosensitive region 21 is composed of an n⁺ type impurity region 23, a p⁺ type impurity region 25, and a region to be depleted with application of a bias voltage in the p⁻ type semiconductor substrate 20. An irregular asperity 10 is formed in the second principal surface 20*b* of the p⁻ type semiconductor substrate 20. An accumulation layer 37 is formed on the second principal surface 20*b* side of the p⁻ type semiconductor substrate 20 and a region in the accumulation layer 37 opposed to the photosensitive region 21 is optically exposed.

5 Claims, 30 Drawing Sheets

(51) Int. Cl.
  *H01L 27/144* (2006.01)
  *H01L 31/107* (2006.01)
  *H01L 31/18* (2006.01)
  *H01L 27/146* (2006.01)

(52) U.S. Cl.
  CPC ........ *H01L 31/0236* (2013.01); *H01L 31/107* (2013.01); *H01L 31/1804* (2013.01); *Y02E 10/547* (2013.01)

(58) Field of Classification Search
  USPC ........................................................ 257/291
  See application file for complete search history.

(56) References Cited

U.S. PATENT DOCUMENTS

| | | |
|---|---|---|
| 5,589,704 A | 12/1996 | Levine |
| 5,763,903 A | 6/1998 | Mandai et al. |
| 6,951,689 B1 | 10/2005 | Higashikawa |
| 7,057,256 B2 | 6/2006 | Carey, III et al. |
| 7,084,443 B2 | 8/2006 | Kitano et al. |
| 7,420,257 B2 | 9/2008 | Shibayama |
| 8,008,741 B2 | 8/2011 | Yamamura et al. |
| 2001/0008144 A1 | 7/2001 | Uematsu et al. |
| 2005/0126627 A1 | 6/2005 | Hayashida |
| 2005/0127401 A1 | 6/2005 | Mazur et al. |
| 2006/0108617 A1 | 5/2006 | Kitano et al. |
| 2006/0278898 A1 | 12/2006 | Shibayama |
| 2007/0007556 A1 | 1/2007 | Shibayama |
| 2007/0152250 A1 | 7/2007 | Kim |
| 2008/0001243 A1 | 1/2008 | Otake et al. |
| 2009/0101197 A1 | 4/2009 | Morikawa |
| 2009/0121306 A1 | 5/2009 | Ishikawa |
| 2009/0142874 A1 | 6/2009 | Arai |
| 2009/0254757 A1 | 10/2009 | Toyama et al. |
| 2011/0266644 A1 | 11/2011 | Yamamura et al. |
| 2011/0291218 A1 | 12/2011 | Yamamura et al. |
| 2011/0303999 A1 | 12/2011 | Sakamoto et al. |
| 2012/0061785 A1 | 3/2012 | Ishikawa et al. |

FOREIGN PATENT DOCUMENTS

| | | |
|---|---|---|
| CN | 1826700 A | 8/2006 |
| CN | 1998083 | 7/2007 |
| EP | 0616373 | 9/1994 |
| EP | 0883189 | 12/1998 |
| EP | 1619722 | 1/2006 |
| EP | 1648036 | 4/2006 |
| EP | 1 840 967 | 10/2007 |
| EP | 1855322 | 11/2007 |
| JP | S49-034398 | 9/1974 |
| JP | 50-147230 | 11/1975 |
| JP | S59-061973 | 4/1984 |
| JP | S59-105380 | 6/1984 |
| JP | S59-117274 | 7/1984 |
| JP | 59-224183 | 12/1984 |
| JP | 62-18075 | 1/1987 |
| JP | S64-011556 | 1/1989 |
| JP | H2-007576 | 1/1990 |
| JP | H3-089518 | 4/1991 |
| JP | H4-116870 | 4/1992 |
| JP | H5-243600 | 9/1993 |
| JP | H6-045623 | 2/1994 |
| JP | H06-244444 | 9/1994 |
| JP | H6-350068 | 12/1994 |
| JP | H6-350122 | 12/1994 |
| JP | 7-235658 | 9/1995 |
| JP | H7-240534 | 9/1995 |
| JP | 8-111542 | 4/1996 |
| JP | H08-242015 | 9/1996 |
| JP | H9-307130 | 11/1997 |
| JP | H10-070298 | 3/1998 |
| JP | H10-173998 | 6/1998 |
| JP | H10-335624 | 12/1998 |
| JP | H11-233519 | 8/1999 |
| JP | 2000-299489 | 10/2000 |
| JP | 2002-170981 | 6/2002 |
| JP | 2002-222975 | 8/2002 |
| JP | 2002-231993 | 8/2002 |
| JP | 2003-232679 | 8/2003 |
| JP | 2003-258277 | 9/2003 |
| JP | 2003-258285 | 9/2003 |
| JP | 2003-294846 | 10/2003 |
| JP | 2004-296827 | 10/2004 |
| JP | 2005-45073 | 2/2005 |
| JP | 2005-203708 | 7/2005 |
| JP | 2006-170729 | 6/2006 |
| JP | 2006-179828 | 7/2006 |
| JP | 2006-186262 | 7/2006 |
| JP | 2007-266327 | 10/2007 |
| JP | 2008-060380 | 3/2008 |
| JP | 2008-066584 | 3/2008 |
| JP | 2008-515196 | 5/2008 |
| JP | 2008-153311 | 7/2008 |
| JP | 2008-229701 | 10/2008 |
| JP | 2008-294454 | 12/2008 |
| JP | 5185206 | 4/2013 |
| TW | 200509383 | 3/2005 |
| TW | 200533898 | 10/2005 |
| WO | 98/43304 | 10/1998 |
| WO | WO 00/62344 | 10/2000 |
| WO | WO 03/072500 | 9/2003 |
| WO | WO 03/096427 | 11/2003 |
| WO | WO 2004/019411 | 3/2004 |
| WO | WO 2008-004547 | 1/2008 |
| WO | 2008/139644 | 11/2008 |
| WO | WO 2009/016776 | 2/2009 |

OTHER PUBLICATIONS

G. E. Miner et al., "High Volume Processing of Point Contact Solar Cells," Photovoltaic Specialists Conference, Las Vegas, Sep. 26-30, 1988; Photovoltaic Specialists Conference, New York, IEEE, US, Sep. 26, 1988, pp. 518-522, XP000166693.
Office Action dated May 6, 2013 that issued in U.S. Appl. No. 13/147,871 including Double Patenting rejections at pp. 2-3.
Office Action dated Aug. 7, 2012 that issued in U.S. Appl. No. 13/143,765 including Double Patenting rejections at pp. 2-4.
Huang Zhihong et al., "Micostructured silicon photodetector," Applied Physics Letters, AIP, American Institute of Physics, Melville, NY, US, vol. 89, No. 3, Jul. 20, 2006, p. 33506-1-p. 33506-3, XP012088050.
U.S. Office Action dated Sep. 18, 2013 that issued in U.S. Appl. No. 13/320,912 including Double Patenting Rejections on pp. 3-5.

PHOTODIODE AND PHOTODIODE ARRAY

This is a continuation application of copending application Ser. No. 13/202,244, having a §371 date of Aug. 18, 2011, which is a national stage filing based on PCT International Application No. PCT/JP2010/052197, filed on Feb. 15, 2010. The copending application Ser. No. 13/202,244 is incorporated by reference herein in its entirety.

TECHNICAL FIELD

The present invention relates to a photodiode and a photodiode array.

BACKGROUND ART

A photodiode using compound semiconductors is known as a photodiode with a high spectral sensitivity characteristic in the near-infrared wavelength band (e.g., cf. Patent Literature 1). The photodiode described in Patent Literature 1 is provided with a first light receiving layer comprised of one of InGaAsN, InGaAsNSb, and InGaAsNP, and a second light receiving layer having an absorption edge at a longer wavelength than that of the first light receiving layer and comprised of a quantum well structure.

CITATION LIST

Patent Literature

Patent Literature 1: Japanese Patent Application Laid-open No. 2008-153311

SUMMARY OF INVENTION

Technical Problem

However, such photodiodes using the compound semiconductors are still expensive and their manufacturing steps are also complicated. For this reason, there are desires for practical application of a silicon photodiode being inexpensive and easy to manufacture and having sufficient spectral sensitivity in the near-infrared wavelength band. The conventional silicon photodiodes generally had the spectral sensitivity characteristic with the limit of about 1100 nm on the long wavelength side, but the spectral sensitivity characteristic in the wavelength band of not less than 1000 nm was not enough.

It is an object of the present invention to provide a silicon photodiode and a silicon photodiode array as a photodiode and a photodiode array having a sufficient spectral sensitivity characteristic in the near-infrared wavelength band.

Solution to Problem

A photodiode according to the present invention is one comprising: a silicon substrate comprised of a semiconductor of a first conductivity type and having a first principal surface and a second principal surface opposed to each other, wherein an avalanche photodiode composed of a pn junction between a semiconductor region of the first conductivity type having a higher impurity concentration than the silicon substrate and a semiconductor region of a second conductivity type is arranged on the first principal surface side of the silicon substrate, wherein on the second principal surface side of the silicon substrate, an accumulation layer of the first conductivity type having a higher impurity concentration than the silicon substrate is formed and an irregular asperity is formed in at least a region opposed to the avalanche photodiode, and wherein the region opposed to the avalanche photodiode in the second principal surface of the silicon substrate is optically exposed.

Since in the photodiode of the present invention the irregular asperity is formed in at least the region opposed to the avalanche photodiode in the second principal surface, light incident into the photodiode is reflected, scattered, or diffused by the region to travel through a long distance in the silicon substrate. This causes the light incident into the photodiode (silicon substrate) to be mostly absorbed in the silicon substrate, without passing through the silicon substrate. In the foregoing photodiode, therefore, the travel distance of the light incident into the photodiode becomes long and the distance of absorption of light also becomes long, so as to improve the spectral sensitivity characteristic in the near-infrared wavelength band.

In the present invention, the accumulation layer of the first conductivity type having the higher impurity concentration than the silicon substrate is formed on the second principal surface side of the silicon substrate. For this reason, unnecessary carriers generated independent of light on the second principal surface side recombine there, so as to reduce dark current. The first conductivity type accumulation layer prevents carriers generated by light near the second principal surface of the silicon substrate from being trapped in the second principal surface. For this reason, the carriers generated by light efficiently migrate to the pn junction between the second conductivity type semiconductor region and the silicon substrate, so as to improve the photodetection sensitivity of the photodiode.

Another photodiode according to the present invention is one comprising: a silicon substrate comprised of a semiconductor of a first conductivity type, having a first principal surface and a second principal surface opposed to each other, and having a semiconductor region of a second conductivity type formed on the first principal surface side, wherein on the silicon substrate, an accumulation layer of the first conductivity type having a higher impurity concentration than the silicon substrate is formed on the second principal surface side and an irregular asperity is formed in at least a region opposed to the semiconductor region of the second conductivity type in the second principal surface, and wherein the region opposed to the semiconductor region of the second conductivity type in the second principal surface of the silicon substrate is optically exposed.

In the photodiode according to the present invention, as described above, the travel distance of light incident into the photodiode becomes long and the distance of absorption of light also becomes long, so as to improve the spectral sensitivity characteristic in the near-infrared wavelength band. The accumulation layer of the first conductivity type formed on the second principal surface side of the silicon substrate reduces the dark current and improves the photodetection sensitivity of the photodiode.

In the photodiode according to the present invention, a portion in the silicon substrate corresponding to the semiconductor region of the second conductivity type may be thinned from the second principal surface side while leaving a surrounding region around the thinned portion. In this case, the photodiode can be obtained with respective light incident surfaces on the first principal surface and second principal surface sides of the silicon substrate.

In the photodiode according to the present invention, preferably, a thickness of the accumulation layer of the first conductivity type is larger than a height difference of the irregular asperity. In this case, as described above, it is feasible to ensure the operational effect by the accumulation layer.

A photodiode array according to the present invention is one comprising: a silicon substrate comprised of a semiconductor of a first conductivity type and having a first principal surface and a second principal surface opposed to each other, wherein a plurality of avalanche photodiodes each composed of a pn junction between a semiconductor region of the first conductivity type having a higher impurity concentration than the silicon substrate and a semiconductor region of a second conductivity type are arranged on the first principal surface side of the silicon substrate, wherein on the second principal surface side of the silicon substrate, an accumulation layer of the first conductivity type having a higher impurity concentration than the silicon substrate is formed and an irregular asperity is formed in at least regions opposed to the avalanche photodiodes, and wherein the regions opposed to the avalanche photodiodes in the second principal surface of the silicon substrate are optically exposed.

In the photodiode array according to the present invention, as described above, the travel distance of light incident into the photodiode array becomes long and the distance of absorption of light also becomes long, so as to improve the spectral sensitivity characteristic in the near-infrared wavelength band. The first conductivity type accumulation layer formed on the second principal surface side of the silicon substrate reduces the dark current and improves the photodetection sensitivity of the photodiode array.

In the photodiode array according to the present invention, a portion in the silicon substrate where the plurality of avalanche photodiodes are arranged may be thinned from the second principal surface side while leaving a surrounding region around the thinned portion. In this case, the photodiode array can be obtained with respective light incident surfaces on the first principal surface and second principal surface sides of the silicon substrate.

In the photodiode array according to the present invention, preferably, a thickness of the accumulation layer of the first conductivity type is larger than a height difference of the irregular asperity. In this case, as described above, it is feasible to ensure the operational effect by the accumulation layer.

Advantageous Effects of Invention

The present invention provides the silicon photodiode and silicon photodiode array as the photodiode and the photodiode array with the sufficient spectral sensitivity characteristic in the near-infrared wavelength band.

DESCRIPTION OF EMBODIMENTS

The preferred embodiments of the present invention will be described below in detail with reference to the accompanying drawings. In the description, the same elements or elements with the same functionality will be denoted by the same reference signs, without redundant description.

(First Embodiment)

A method for manufacturing a photodiode according to the first embodiment will be described with reference to FIGS. 1 to 10. FIGS. 1 to 10 are drawings for explaining the manufacturing method of the photodiode according to the first embodiment.

Figure 1:
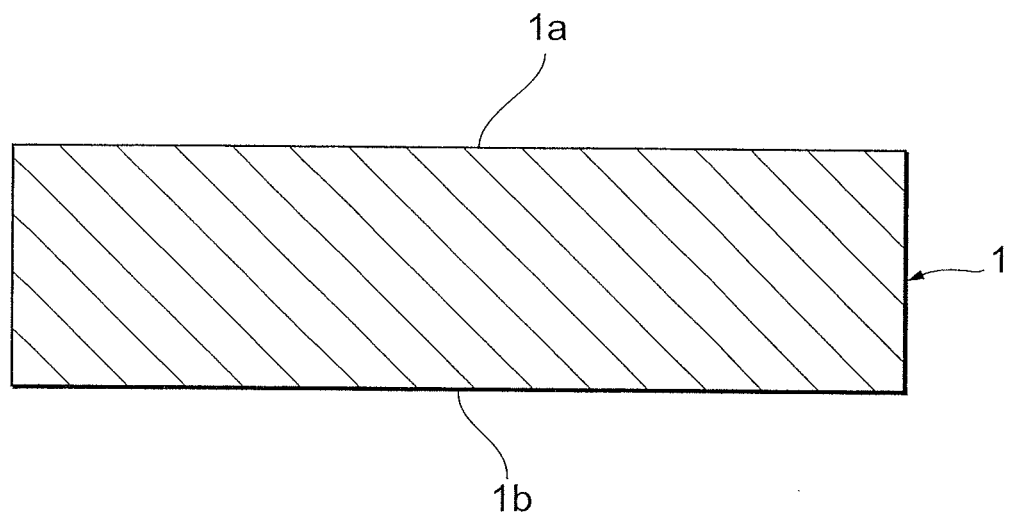
FIG. 1 is a drawing for explaining a manufacturing method of a photodiode according to the first embodiment.

The first step is to prepare an $n^-$ type semiconductor substrate 1 comprised of silicon (Si) crystal and having a first principal surface 1a and a second principal surface 1b opposed to each other (cf. FIG. 1). The $n^-$ type semiconductor substrate 1 has the thickness of about 300 μm and the resistivity of about 1 kΩ·cm. In the present embodiment, a "high impurity concentration" refers to, for example, an impurity concentration of not less than about $1 \times 10^{17}$ $cm^{-3}$ and is denoted by sign "+" attached to conductivity type. A "low impurity concentration" refers to, for example, an impurity concentration of not more than about $1 \times 10^{15}$ $cm^{-3}$ and is denoted by sign "−" attached to conductivity type. Examples of n-type impurities include antimony (Sb), arsenic (As), and so on, and examples of p-type impurities include boron (B) and others.

Figure 2:
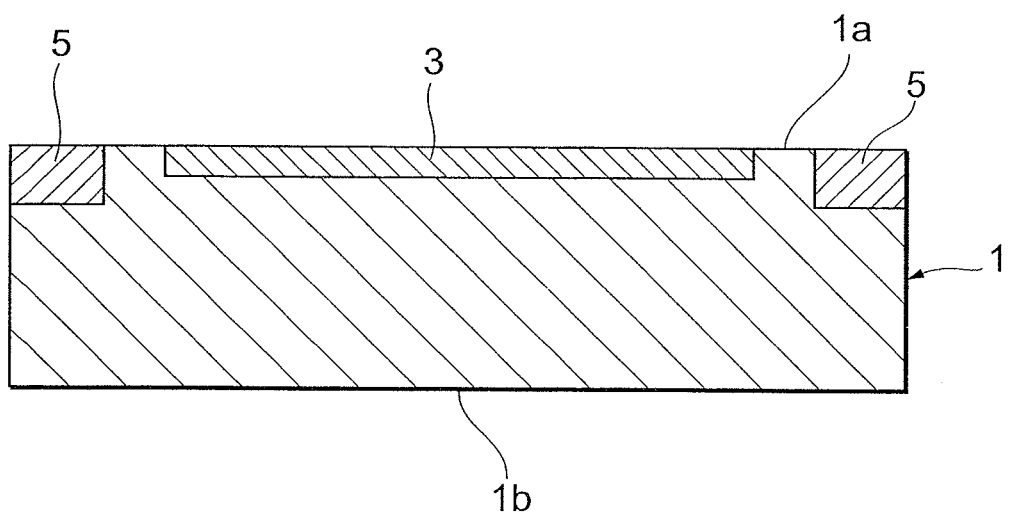
FIG. 2 is a drawing for explaining the manufacturing method of the photodiode according to the first embodiment.

Next, a $p^+$ type semiconductor region 3 and an $n^+$ type semiconductor region 5 are formed on the first principal surface 1a side of the $n^-$ type semiconductor substrate 1 (cf. FIG. 2). The $p^+$ type semiconductor region 3 is formed by diffusing a p-type impurity in a high concentration from the first principal surface 1a side in the $n^-$ type semiconductor substrate 1, using a mask opening in a central region. The $n^+$ type semiconductor region 5 is formed by diffusing an n-type impurity in a higher concentration than in the $n^-$ type semiconductor substrate 1, from the first principal surface 1a side in the $n^-$ type semiconductor substrate 1 so as to surround the $p^+$ type semiconductor region 3, using another mask opening in a peripheral region. The $p^+$ type semiconductor region 3 has the thickness of, for example, about 0.55 μm and the sheet resistance of, for example, 44 Ω/sq. The $n^+$ type semiconductor region 5 has the thickness of, for example, about 1.5 μm and the sheet resistance of, for example, 12 Ω/sq.

Figure 3:
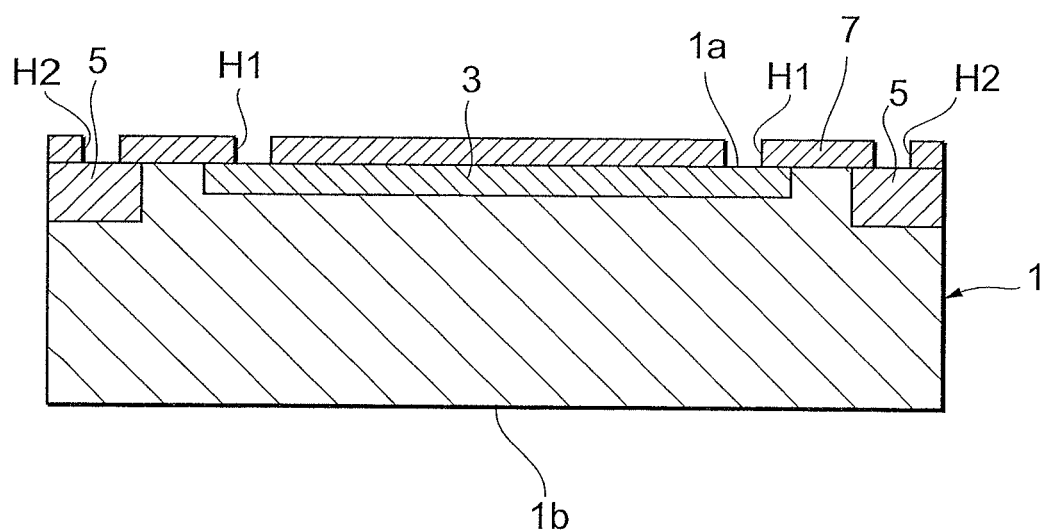
FIG. 3 is a drawing for explaining the manufacturing method of the photodiode according to the first embodiment.

Next, an insulating layer 7 is formed on the first principal surface 1a side of the $n^-$ type semiconductor substrate 1 (cf. FIG. 3). The insulating layer 7 is comprised of $SiO_2$ and is formed by thermal oxidation of the $n^-$ type semiconductor substrate 1. The insulating layer 7 has the thickness of, for example, about 0.1 μm. Thereafter, a contact hole H1 is formed in the insulating layer 7 on the $p^+$ type semiconductor region 3 and a contact hole H2 is formed in the insulating layer 7 on the $n^+$ type semiconductor region 5. An antireflective (AR) layer comprised of SiN may be formed instead of the insulating layer 7.

Figure 4:
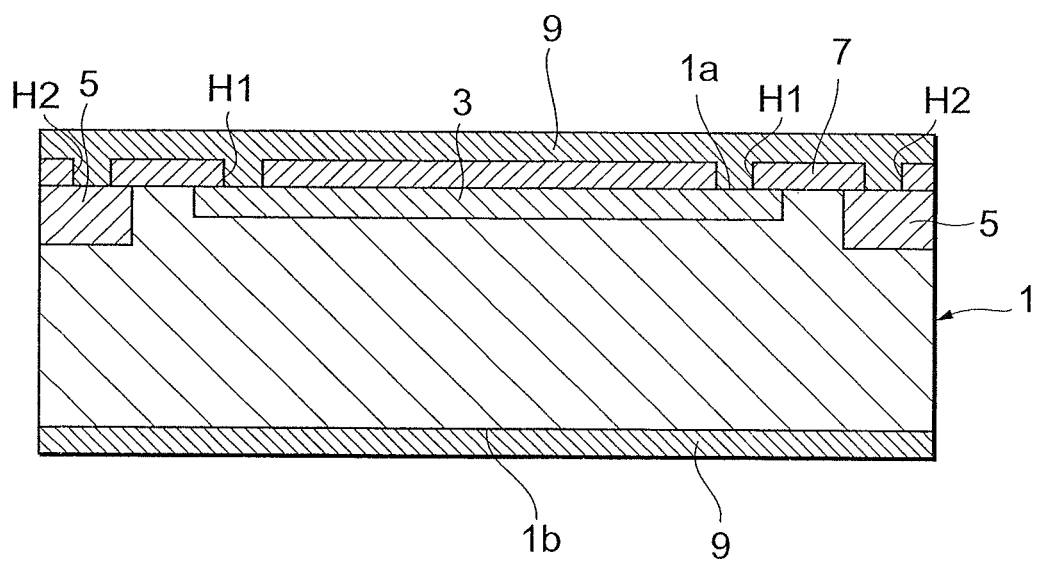
FIG. 4 is a drawing for explaining the manufacturing method of the photodiode according to the first embodiment.
Figure 5:
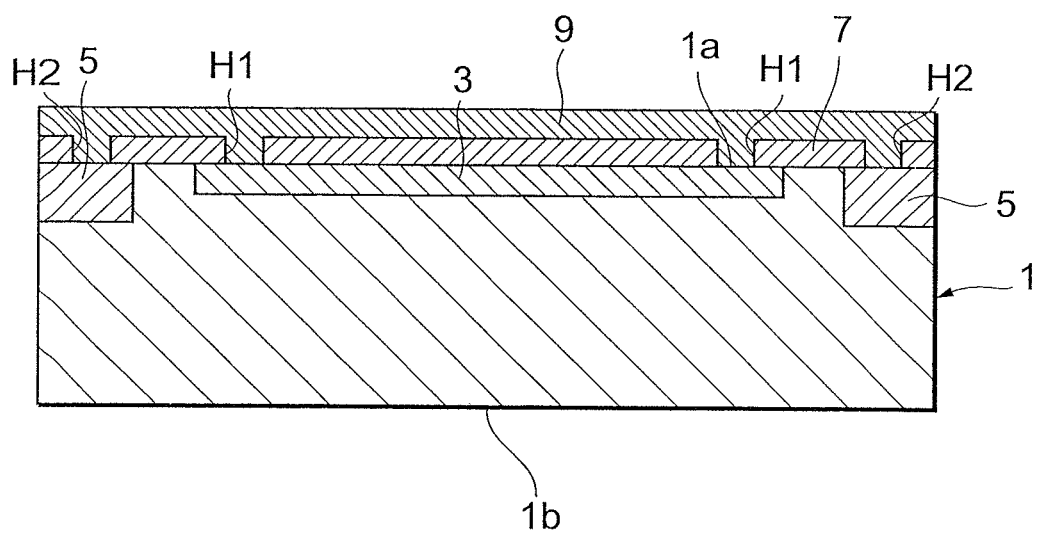
FIG. 5 is a drawing for explaining the manufacturing method of the photodiode according to the first embodiment.

Next, a passivation layer 9 is formed on the second principal surface 1b of the $n^-$ type semiconductor substrate 1 and on the insulating layer 7 (cf. FIG. 4). The passivation layer 9 is comprised of SiN and is formed, for example, by the plasma CVD process. The passivation layer 9 has the thickness of, for example, 0.1 μm. Then the $n^-$ type semiconductor substrate 1 is polished from the second principal surface 1b side before the thickness of the $n^-$ type semiconductor substrate 1 reaches a desired thickness (cf. FIG. 5). This process removes the passivation layer 9 from on the second principal surface 1b of the $n^-$ type semiconductor substrate 1, thereby exposing the $n^-$ type semiconductor substrate 1. A surface exposed by polishing is also referred to herein as the second principal surface 1b. The desired thickness is, for example, 270 μm.

Figure 6:
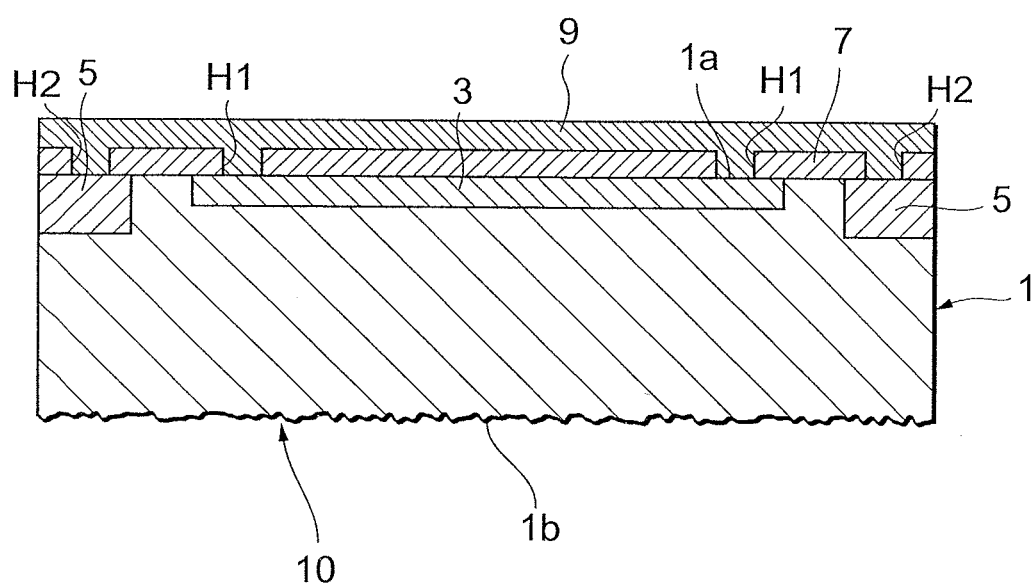
FIG. 6 is a drawing for explaining the manufacturing method of the photodiode according to the first embodiment.
Figure 7:
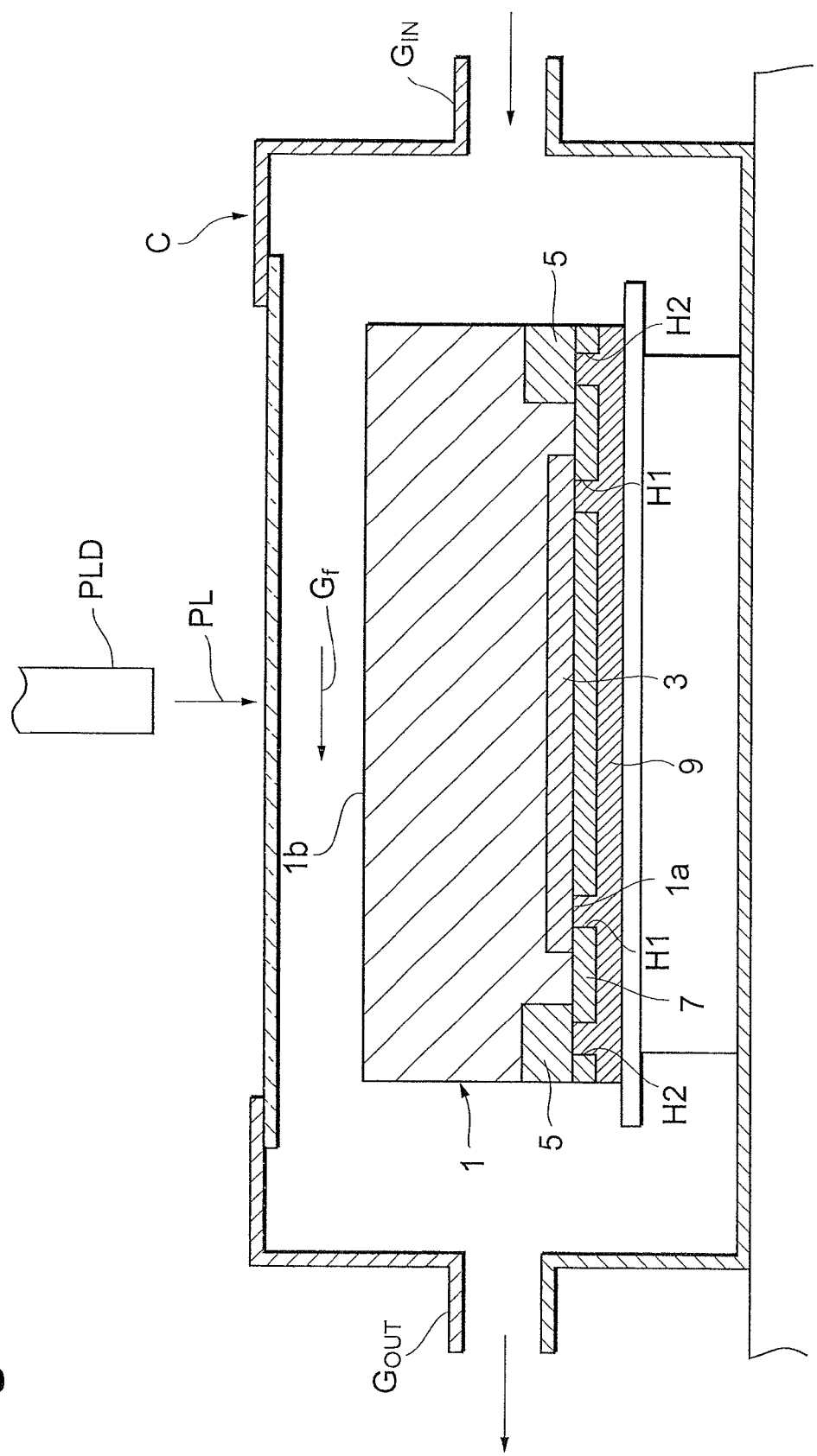
FIG. 7 is a drawing for explaining the manufacturing method of the photodiode according to the first embodiment.

Next, the second principal surface 1b of the $n^-$ type semiconductor substrate 1 is subjected to irradiation with a pulsed laser beam PL, thereby forming an irregular asperity 10 (cf FIG. 6). In this step, as shown in FIG. 7, the $n^-$ type semiconductor substrate 1 is placed in a chamber C, and the $n^-$ type semiconductor substrate 1 is irradiated with the pulsed laser beam PL from a pulse laser generating device PLD located outside the chamber C. The chamber C has a gas inlet port $G_{IN}$ and a gas outlet port $G_{OUT}$ and an inert gas (e.g., nitrogen gas, argon gas, or the like) is introduced through the gas inlet port $G_{IN}$ and discharged through the gas outlet port $G_{OUT}$. This forms an inert gas flow $G_f$ in the chamber C. Dust and other materials made during the irradiation with the pulsed laser beam PL are discharged as trapped into the inert gas flow $G_f$, to the outside of the chamber C, thereby preventing processing debris, dust, and other materials from attaching to the $n^-$ type semiconductor substrate 1.

Figure 8:
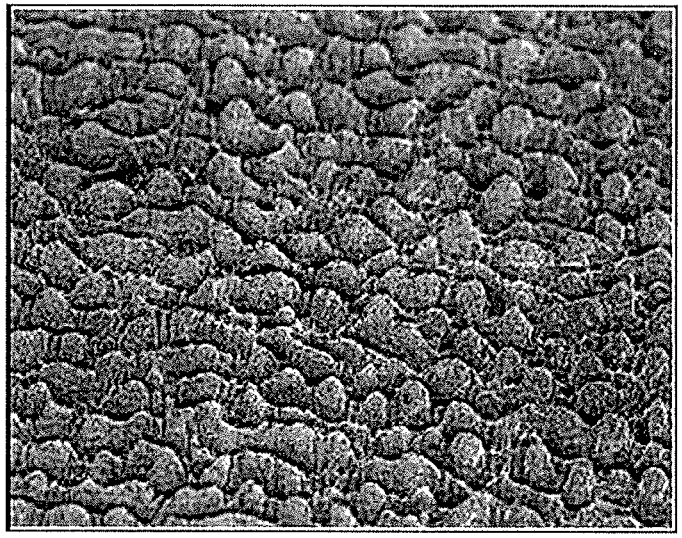
FIG. 8 is a drawing for explaining the manufacturing method of the photodiode according to the first embodiment.

In the present embodiment, the pulse laser generating device PLD to be used is a picosecond to femtosecond pulse laser generating device and a picosecond to femtosecond pulsed laser beam is applied across the entire area of the second principal surface 1b. The second principal surface 1b is roughened by the picosecond to femtosecond pulsed laser beam, whereby the irregular asperity 10 is formed throughout the entire area of the second principal surface 1b, as shown in FIG. 8. The irregular asperity 10 has facets intersecting with a direction perpendicular to the first principal surface 1a. The height difference of asperity 10 is, for example, about 0.5 to 10 μm and the spacing of projections in the asperity 10 is about 0.5 to 10 μm. The picosecond to femtosecond pulsed laser beam has the pulse duration of, for example, about 50 fs-2 ps, the intensity of, for example, about 4 to 16 GW, and the pulse energy of, for example, about 200 to 800 μJ/pulse. More generally, the peak intensity is $3 \times 10^{11}$ to $2.5 \times 10^{13}$ ($W/cm^2$) and the fluence is about 0.1 to 1.3 ($J/cm^2$). FIG. 8 is an SEM image resulting from observation of the irregular asperity 10 formed in the second principal surface 1b.

Figure 9:
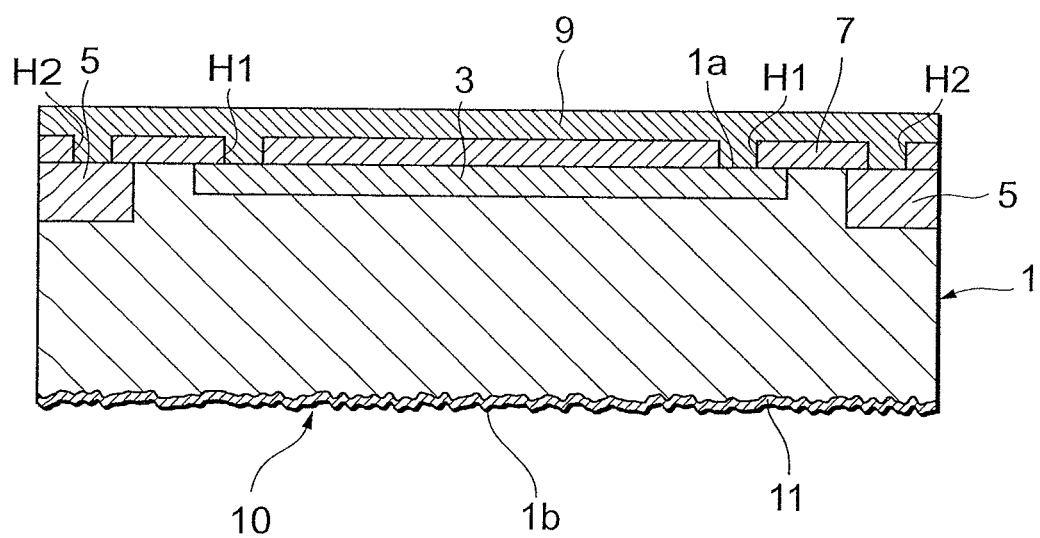
FIG. 9 is a drawing for explaining the manufacturing method of the photodiode according to the first embodiment.

Next, an accumulation layer 11 is formed on the second principal surface 1b side of the $n^-$ type semiconductor substrate 1 (cf. FIG. 9). In this step, the accumulation layer 11 is formed by ion implantation or diffusion of an n-type impurity from the second principal surface 1b side in the n semiconductor substrate 1 so that an impurity concentration thereof becomes higher than that of the $n^-$ type semiconductor substrate 1. The accumulation layer 11 has the thickness of, for example, about 1 μm.

Next, the $n^-$ type semiconductor substrate 1 is subjected to a thermal treatment (annealing). In this step, the $n^-$ type semiconductor substrate 1 is heated, for example, in the temperature range of about 800 to 1000° C. under an ambiance of $N_2$ gas for about 0.5 to 1 hour.

Figure 10:
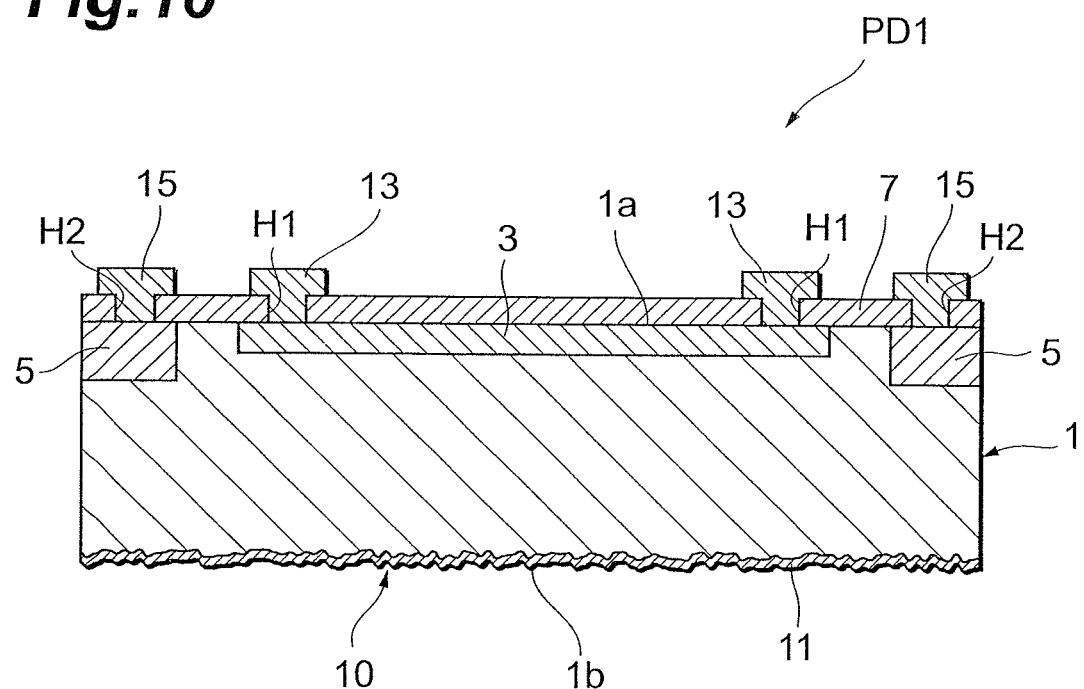
FIG. 10 is a drawing for explaining the manufacturing method of the photodiode according to the first embodiment.

Next, the passivation layer 9 formed on the insulating layer 7 is removed and thereafter electrodes 13, 15 are formed (cf. FIG. 10). The electrode 13 is fondled in the contact hole H1 and the electrode 15 in the contact hole H2. The electrodes 13, 15 each are comprised of aluminum (Al) or the like and have the thickness of, for example, about 1 μm. This completes the photodiode PD1.

The photodiode PD1 is provided with the $n^-$ type semiconductor substrate 1, as shown in FIG. 10. The $p^+$ type semiconductor region 3 and the $n^+$ type semiconductor region 5 are formed on the first principal surface 1a side of the $n^-$ type semiconductor substrate 1 and a pn junction is formed between the n⁻ type semiconductor substrate 1 and the p⁺ type semiconductor region 3. The electrode 13 is in electrical contact with and connection to the p⁺ type semiconductor region 3 through the contact hole H1. The electrode 15 is in electrical contact with and connection to the n⁺ type semiconductor region 5 through the contact hole H2.

The irregular asperity 10 is formed in the second principal surface 1*b* of the n⁻ type semiconductor substrate 1. The accumulation layer 11 is formed on the second principal surface 1*b* side of the n⁻ type semiconductor substrate 1 and the second principal surface 1*b* is optically exposed. That the second principal surface 1*b* is optically exposed encompasses not only the case where the second principal surface 1*b* is in contact with ambient gas such as air, but also the case where an optically transparent film is formed on the second principal surface 1*b*.

Figure 11:
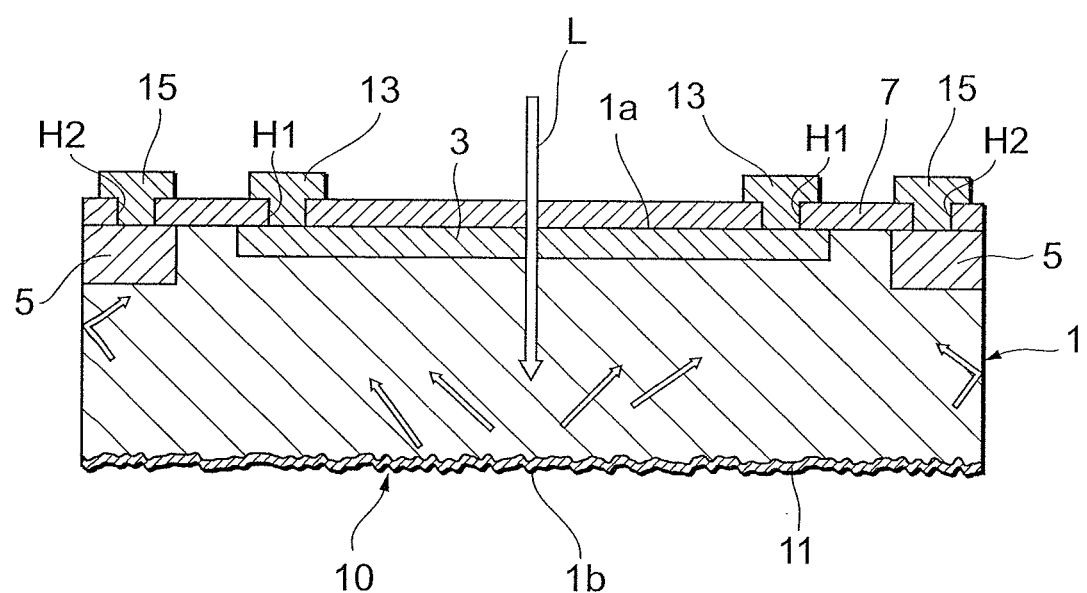
FIG. 11 is a drawing showing a configuration of the photodiode according to the first embodiment.

In the photodiode PD1, the irregular asperity 10 is formed in the second principal surface 1*b*. For this reason, light L incident into the photodiode PD1 is reflected, scattered, or diffused by the asperity 10, as shown in FIG. 11, to travel through a long distance in the n⁻ type semiconductor substrate 1.

Normally, Si has the refractive index n=3.5 and air the refractive index n=1.0. In a photodiode, when light is incident from a direction normal to a light incident surface, light remaining unabsorbed in the photodiode (silicon substrate) is separated into a light component reflected on the back surface to the light incident surface and a light component passing through the photodiode. The light passing through the photodiode does not contribute to the sensitivity of the photodiode. The light component reflected on the back surface to the light incident surface, if absorbed in the photodiode, becomes a photocurrent. A light component still remaining unabsorbed is reflected or transmitted by the light incident surface as the light component having reached the back surface to the light incident surface was.

In the photodiode PD1, where light L is incident from the direction normal to the light incident surface (first principal surface 1*a*), when the light reaches the irregular asperity 10 formed in the second principal surface 1*b*, light components arriving thereat at angles of not less than 16.6° to a direction of emergence from the asperity 10 are totally reflected by the asperity 10. Since the asperity 10 is formed irregularly, it has various angles to the emergence direction and the totally reflected light components diffuse into various directions. For this reason, the totally reflected light components include light components absorbed inside the n⁻ type semiconductor substrate 1 and light components arriving at the first principal surface 1*a* and side faces.

The light components arriving at the first principal surface 1*a* and side faces travel in various directions because of the diffusion on the asperity 10. For this reason, the light components arriving at the first principal surface 1*a* and the side faces are extremely highly likely to be totally reflected on the first principal surface 1*a* and the side faces. The light components totally reflected on the first principal surface 1*a* and the side faces are repeatedly totally reflected on different faces to further increase their travel distance. In this manner, the light L incident into the photodiode PD1 is absorbed in the n⁻ type semiconductor substrate 1 during travel through the long distance inside the n⁻ type semiconductor substrate 1 to be detected as a photocurrent.

As described above, the light L incident into the photodiode PD1 mostly travels, without being transmitted by the photodiode PD1, through the long travel distance to be absorbed in the n⁻ type semiconductor substrate 1. Therefore, the photodiode PD1 is improved in the spectral sensitivity characteristic in the near-infrared wavelength band.

If a regular asperity is formed in the second principal surface 1*b*, the light components arriving at the first principal surface 1*a* and the side faces are diffused by the asperity but travel in uniform directions. Therefore, the light components arriving at the first principal surface 1*a* and the side faces are less likely to be totally reflected on the first principal surface 1*a* and the side faces. This results in increase in light passing through the first principal surface 1*a* and the side faces, and through the second principal surface 1*b*, and thus the travel distance of the light incident into the photodiode must be short. As a result, it becomes difficult to improve the spectral sensitivity characteristic in the near-infrared wavelength band.

An experiment was conducted in order to check the effect of improvement in the spectral sensitivity characteristic in the near-infrared wavelength band by the first embodiment.

We fabricated a photodiode with the above-described configuration (referred to as Example 1) and a photodiode without the irregular asperity in the second principal surface of the n⁻ type semiconductor substrate (referred to as Comparative Example 1), and investigated their spectral sensitivity characteristics. Example 1 and Comparative Example 1 have the same configuration, except for the formation of the irregular asperity by irradiation with the pulsed laser beam. The size of the n⁻ type semiconductor substrate 1 was set to 6.5 mm×6.5 mm. The size of the p⁺ type semiconductor region 3, or a photosensitive region was set to 5.8 mm×5.8 mm. A bias voltage VR applied to the photodiodes was set to 0 V.

Figure 12:
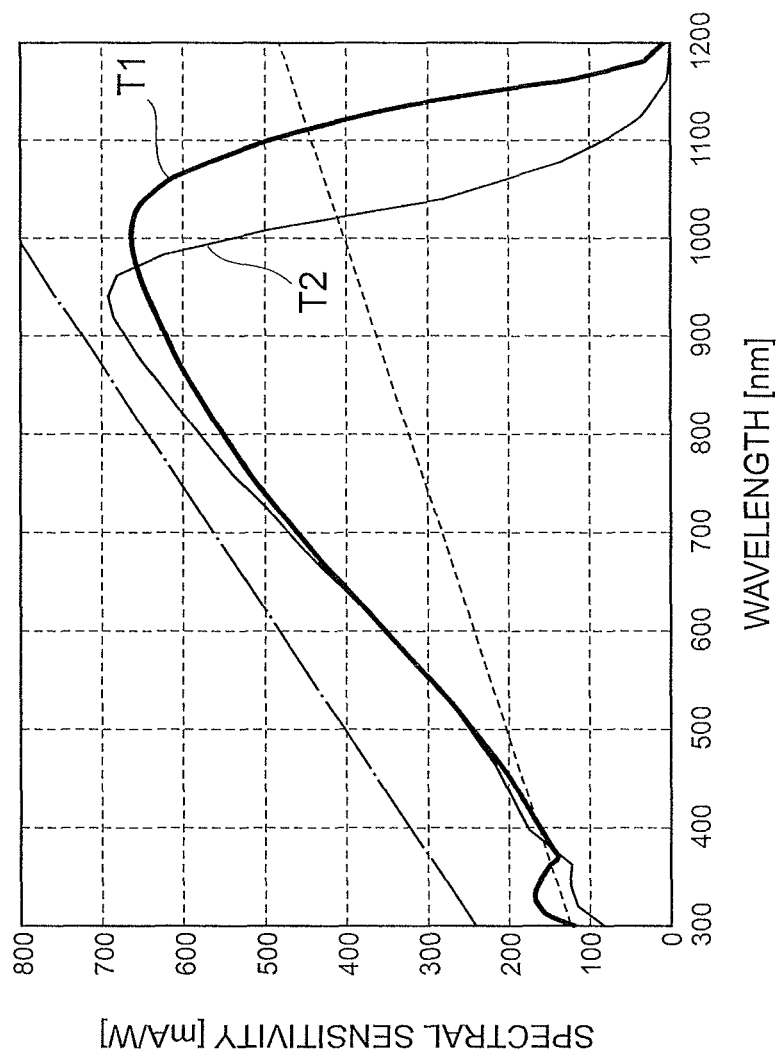
FIG. 12 is a diagram showing changes of spectral sensitivity versus wavelength in Example 1 and Comparative Example 1.

The results are shown in FIG. 12. In FIG. 12, the spectral sensitivity characteristic of Example 1 is represented by T1 and the spectral sensitivity characteristic of Comparative Example 1 by characteristic T2. In FIG. 12, the vertical axis represents the spectral sensitivity (mA/W) and the horizontal axis the wavelength of light (nm). A characteristic indicated by a chain line represents a spectral sensitivity characteristic where the quantum efficiency (QE) is 100%, and a characteristic indicated by a dashed line, a spectral sensitivity characteristic where the quantum efficiency is 50%.

As seen from FIG. 12, for example at 1064 nm, the spectral sensitivity in Comparative Example 1 is 0.2 A/W (QE=25%,) whereas the spectral sensitivity in Example 1 is 0.6 A/W (QE=72%,); thus the spectral sensitivity in the near-infrared wavelength band is drastically improved.

Figure 13:
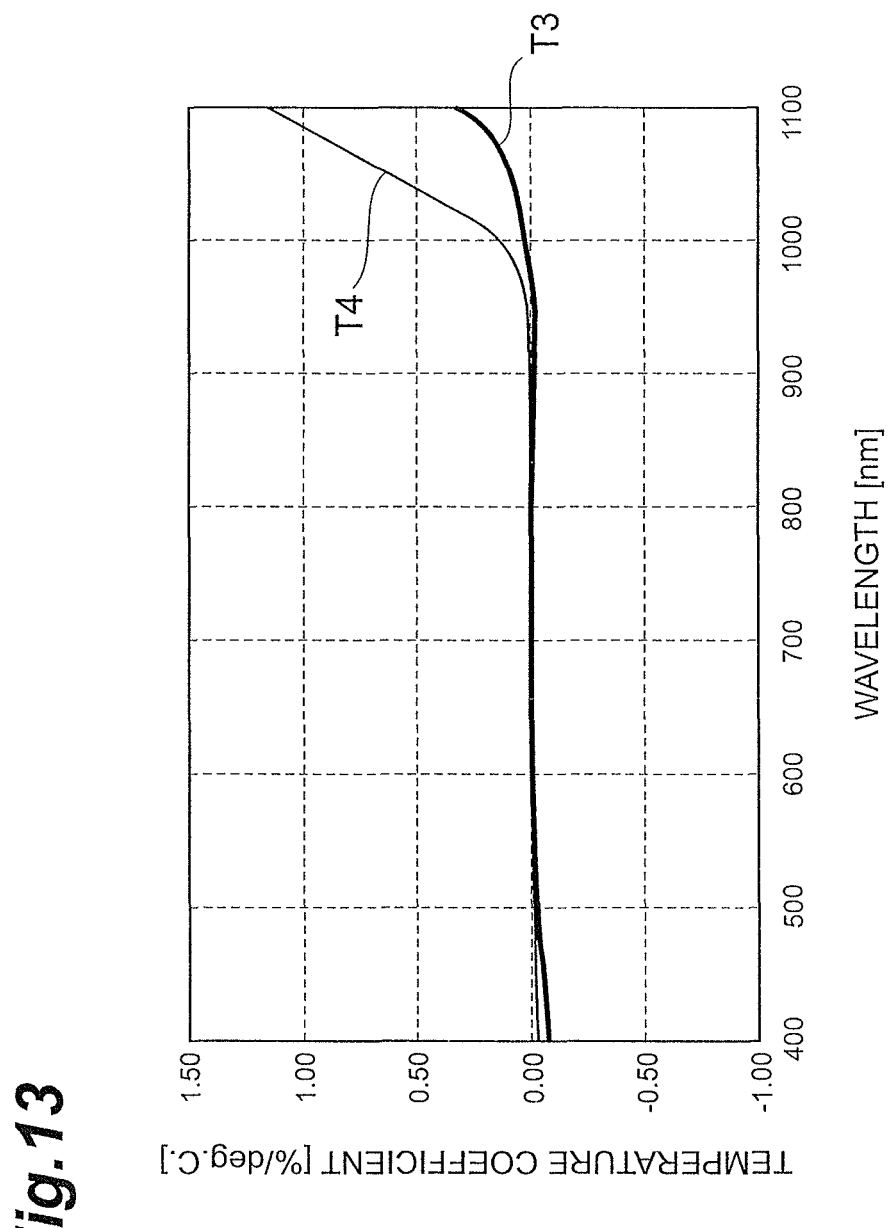
FIG. 13 is a diagram showing changes of temperature coefficient versus wavelength in Example 1 and Comparative Example 1.

We also checked temperature characteristics of spectral sensitivity in Example 1 and Comparative Example 1. We investigated the spectral sensitivity characteristics with increase in ambient temperature from 25° C. to 60° C. and calculated a rate (temperature coefficient) of spectral sensitivity at 60° C. to spectral sensitivity at 25° C. The results are shown in FIG. 13. In FIG. 13, the characteristic of temperature coefficient of Example 1 is represented by T3 and that of Comparative Example 1 by characteristic T4. In FIG. 13, the vertical axis represents the temperature coefficient (%/° C.) and the horizontal axis the wavelength of light (nm).

As seen from FIG. 13, for example at 1064 nm, the temperature coefficient in Comparative Example 1 is 0.7%/° C., whereas the temperature coefficient in Example 1 is 0.2%/° C., demonstrating lower temperature dependence. In general, an increase in temperature leads to an increase in spectral sensitivity because of increase in absorption coefficient and decrease in bandgap energy. In Example 1, since the spectral sensitivity is sufficiently high even at room temperature, the change of spectral sensitivity due to temperature rise is smaller than in Comparative Example 1.

In the photodiode PD1, the accumulation layer 11 is formed on the second principal surface 1b side of the n⁻ type semiconductor substrate 1. This induces recombination of unnecessary carriers generated independent of light on the second principal surface 1b side, which can reduce dark current. The accumulation layer 11 prevents carriers generated by light near the second principal surface 1b, from being trapped in the second principal surface 1b. For this reason, the carriers generated by light efficiently migrate to the pn junction, which can further improve the photodetection sensitivity of the photodiode PD1.

In the first embodiment, after the formation of the accumulation layer 11, the n⁻ type semiconductor substrate 1 is subjected to the thermal treatment. This treatment restores the crystallinity of the n⁻ type semiconductor substrate 1, which can prevent such a problem as increase of dark current.

In the first embodiment, after the thermal treatment of the n⁻ type semiconductor substrate 1, the electrodes 13, 15 are formed. This prevents the electrodes 13, 15 from melting during the thermal treatment, even in the case where the electrodes 13, 15 are made of a metal with a relatively low melting point. As a result, the electrodes 13, 15 can be appropriately farmed without being affected by the thermal treatment.

In the first embodiment, the irregular asperity 10 is formed by the irradiation with the picosecond to femtosecond pulsed laser beam. This permits the irregular asperity 10 to be appropriately and readily formed.

(Second Embodiment)

Figure 14:
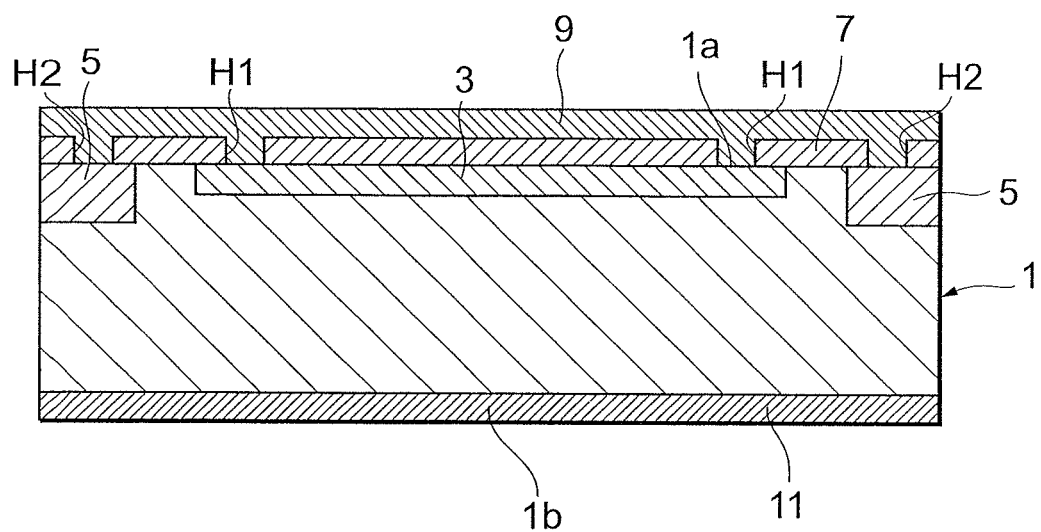
FIG. 14 is a drawing for explaining a manufacturing method of a photodiode according to the second embodiment.
Figure 15:
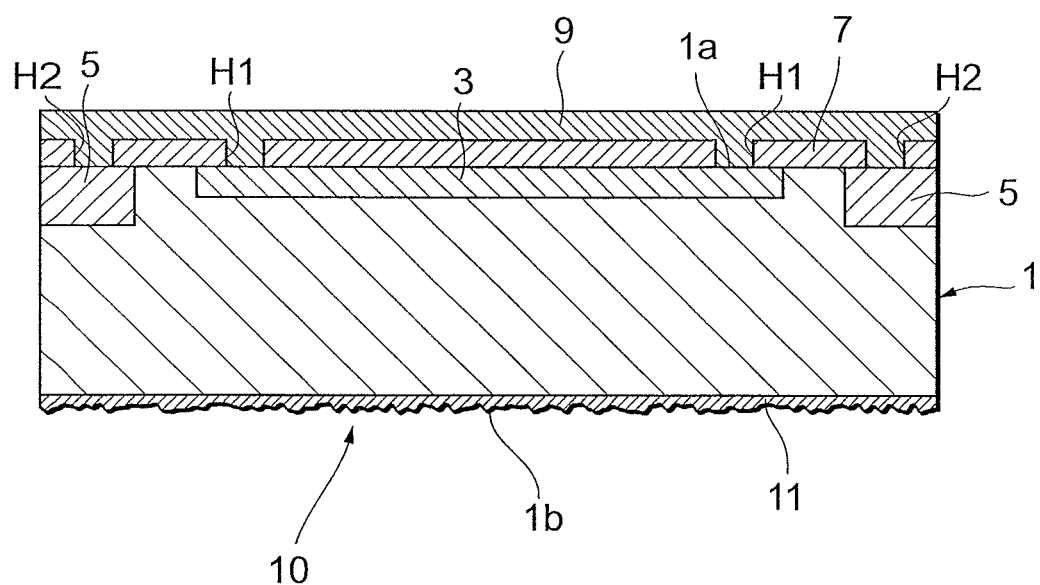
FIG. 15 is a drawing for explaining the manufacturing method of the photodiode according to the second embodiment.
Figure 16:
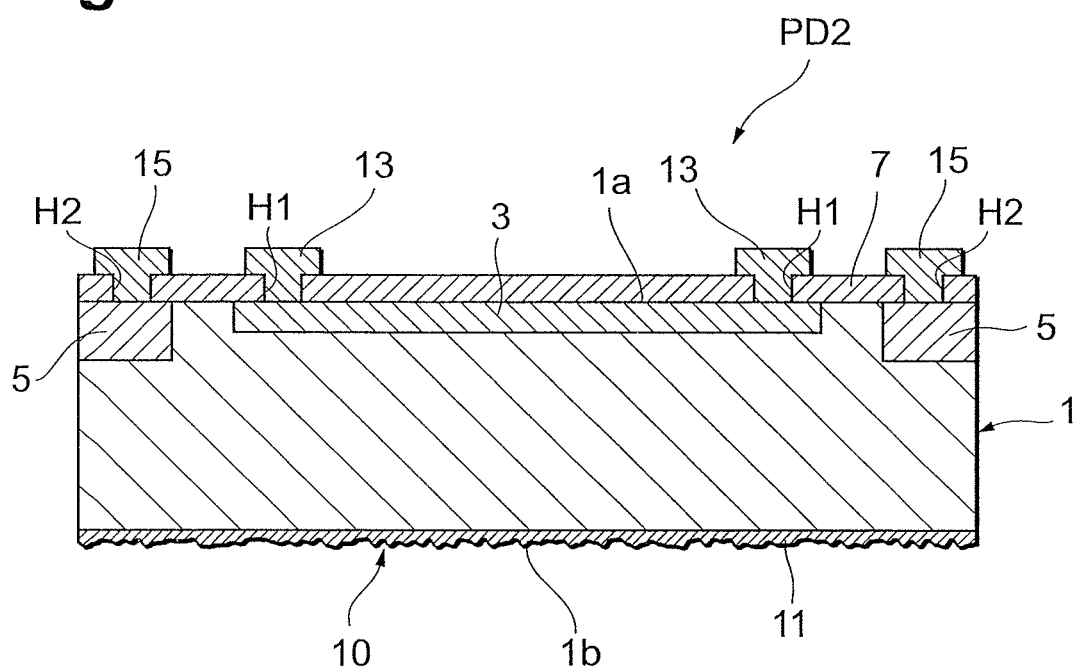
FIG. 16 is a drawing for explaining the manufacturing method of the photodiode according to the second embodiment.
Figure 17:
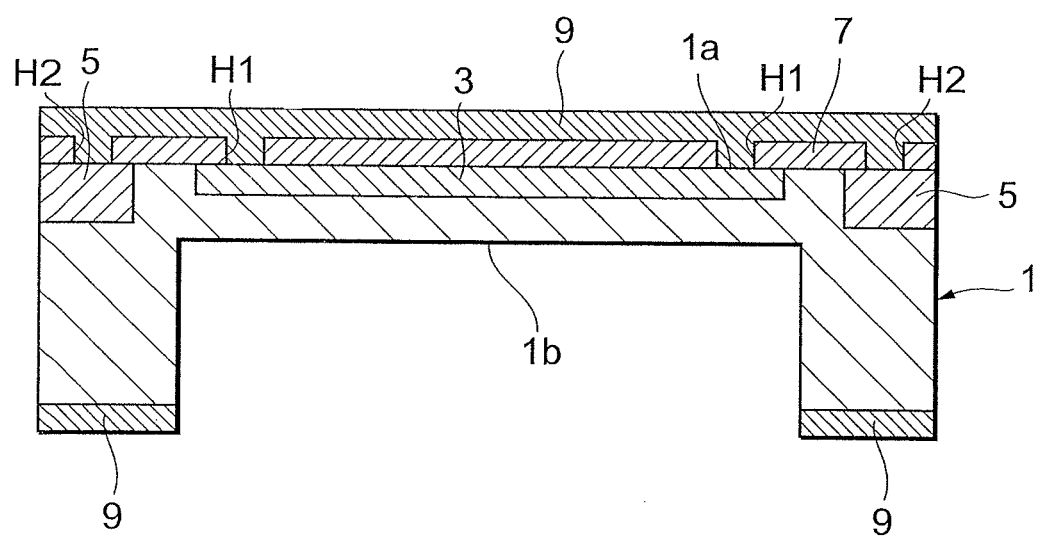
FIG. 17 is a drawing for explaining a manufacturing method of a photodiode according to the third embodiment.

A method for manufacturing a photodiode according to the second embodiment will be described with reference to FIGS. 14 to 16. FIGS. 14 to 16 are drawings for explaining the manufacturing method of the photodiode according to the second embodiment.

The manufacturing method of the second embodiment, up to the polishing of the n⁻ type semiconductor substrate 1 from the second principal surface 1b side, is the same as the manufacturing method of the first embodiment, and the description of the previous steps before it is omitted herein. After the n⁻ type semiconductor substrate 1 is polished from the second principal surface 1b side to obtain the n⁻ type semiconductor substrate 1 in the desired thickness, the accumulation layer 11 is formed on the second principal surface 1b side of the n⁻ type semiconductor substrate 1 (cf. FIG. 14). The formation of the accumulation layer 11 is carried out in the same manner as in the first embodiment. The accumulation layer 11 has the thickness of, for example, about 1μm.

Next, the second principal surface 1b of the n⁻ type semiconductor substrate 1 is irradiated with the pulsed laser beam PL to form the irregular asperity 10 (cf. FIG. 15). The formation of the irregular asperity 10 is carried out in the same manner as in the first embodiment.

Next, as in the first embodiment, the n⁻ type semiconductor substrate 1 is subjected to a thermal treatment. Thereafter, the passivation layer 9 formed on the insulating layer 7 is removed and then the electrodes 13, 15 are formed (cf. FIG. 16). This completes the photodiode PD2.

In the second embodiment, as in the first embodiment, the travel distance of light incident into the photodiode PD2 also becomes long and the distance of absorption of light also becomes long. This allows the photodiode PD2 also to be improved in the spectral sensitivity characteristic in the near-infrared wavelength band.

In the second embodiment, the thickness of the accumulation layer 11 is larger than the height difference of the irregular asperity 10. For this reason, even if the irregular asperity 10 is formed by the irradiation with the pulsed laser beam after the formation of the accumulation layer 11, the accumulation layer 11 remains with certainty. Therefore, it is feasible to ensure the operational effect by the accumulation layer 11.

(Third Embodiment)

A method for manufacturing a photodiode according to the third embodiment will be described with reference to FIGS. 17 to 21. FIGS. 17 to 21 are drawings for explaining the manufacturing method of the photodiode according to the third embodiment.

The manufacturing method of the third embodiment, up to the formation of the passivation layer 9, is the same as the manufacturing method of the first embodiment, and the description of the previous steps before it is omitted herein. After the formation of the passivation layer 9, a portion corresponding to the p⁺ type semiconductor region 3 in the n⁻ type semiconductor substrate 1 is thinned from the second principal surface 1b side while leaving a surrounding region around the thinned portion (cf. FIG. 17). The thinning of the n⁻ type semiconductor substrate 1 is carried out, for example, by anisotropic etching based on alkali etching using a potassium hydroxide solution, TMAH (tetramethylammonium hydroxide solution), or the like. The thinned portion of the n⁻ type semiconductor substrate 1 has the thickness of, for example, about 100 μm, and the surrounding region around it has the thickness of, for example, about 300 μm.

Figure 18:
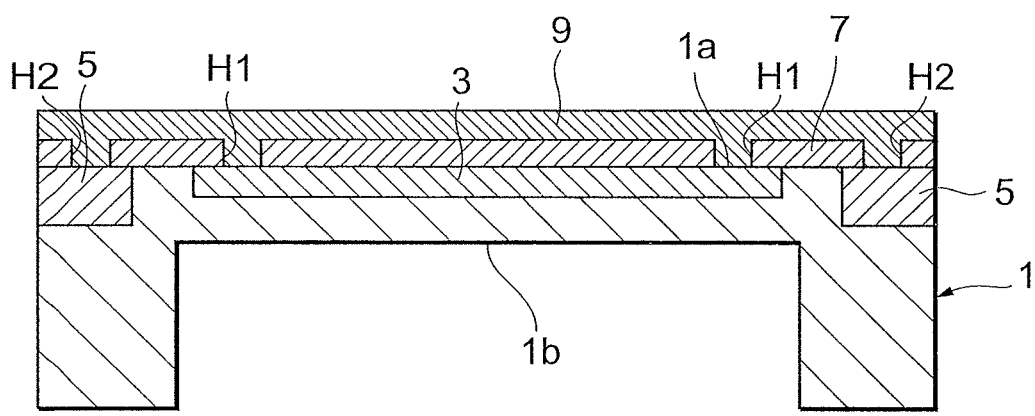
FIG. 18 is a drawing for explaining the manufacturing method of the photodiode according to the third embodiment.

Next, the n⁻ type semiconductor substrate 1 is polished from the second principal surface 1b side before the thickness of the surrounding region of the n⁻ type semiconductor substrate 1 reaches a desired thickness (cf. FIG. 18). The desired thickness herein is, for example, 270 μm.

Figure 19:
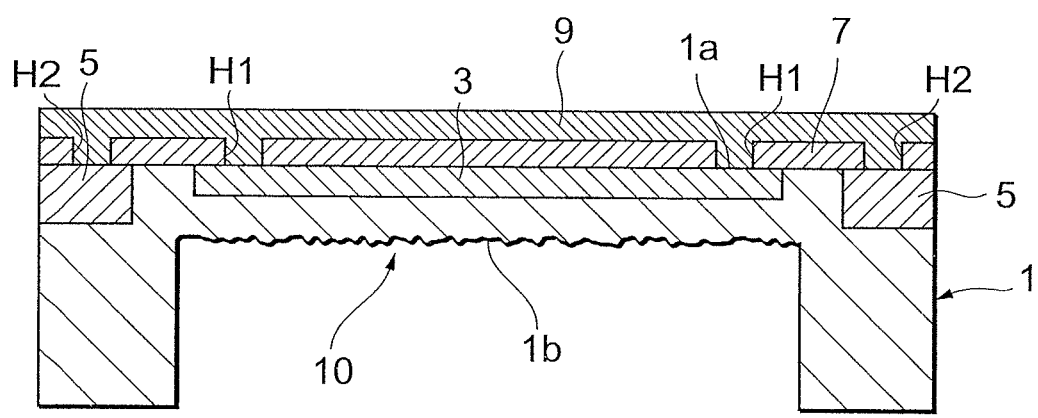
FIG. 19 is a drawing for explaining the manufacturing method of the photodiode according to the third embodiment.

Next, the second principal surface 1b of the n⁻ type semiconductor substrate 1 is irradiated with the pulsed laser beam PL to form the irregular asperity 10 (cf. FIG. 19). The formation of the irregular asperity 10 is carried out in the same manner as in the first embodiment.

Figure 20:
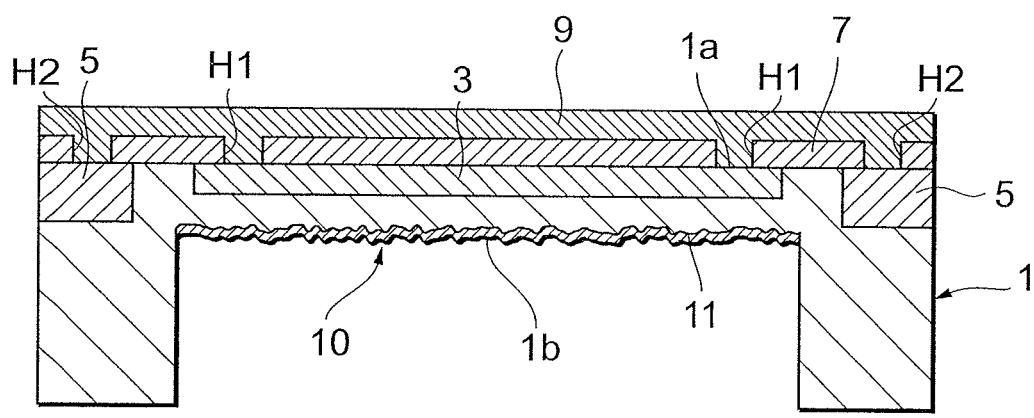
FIG. 20 is a drawing for explaining the manufacturing method of the photodiode according to the third embodiment.

Next, the accumulation layer 11 is formed on the second principal surface 1b side of the thinned portion of the n⁻ type semiconductor substrate 1 (cf. FIG. 20). The formation of the accumulation layer 11 is carried out in the same manner as in the first embodiment. The accumulation layer 11 has the thickness of, for example, about 3 μm.

Figure 21:
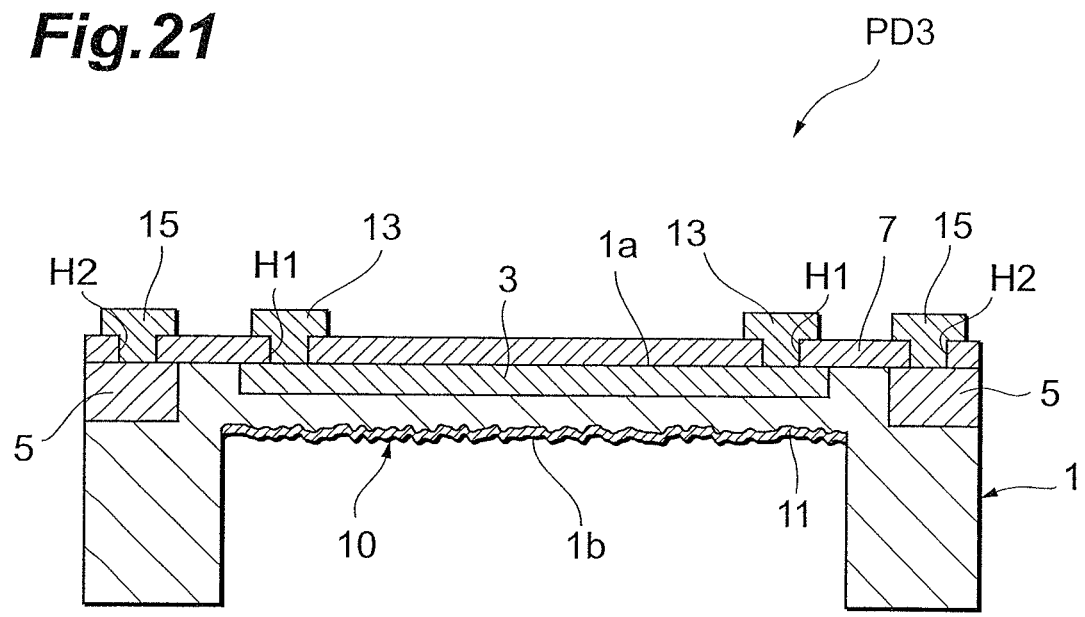
FIG. 21 is a drawing for explaining the manufacturing method of the photodiode according to the third embodiment.

Next, as in the first embodiment, the n⁻ type semiconductor substrate 1 is subjected to a thermal treatment and thereafter, the passivation layer 9 formed on the insulating layer 7 is removed, followed by formation of the electrodes 13, 15 (cf. FIG. 21). This completes the photodiode PD3.

In the third embodiment, as in the first and second embodiments, the travel distance of light incident into the photodiode PD3 also becomes long and the distance of absorption of light also becomes long. This allows the photodiode PD3 also to be improved in the spectral sensitivity characteristic in the near-infrared wavelength band.

In the third embodiment, prior to the formation of the irregular asperity 10, the portion corresponding to the p⁺ type semiconductor region 3 in the n⁻ type semiconductor substrate 1 is thinned from the second principal surface 1b side while leaving the surrounding region around the thinned portion. This permits the photodiode PD3 to be formed with respective light incident surfaces on the first principal surface 1a and the second principal surface 1b sides of the n⁻ type semiconductor substrate 1.

(Fourth Embodiment)

Figure 22:
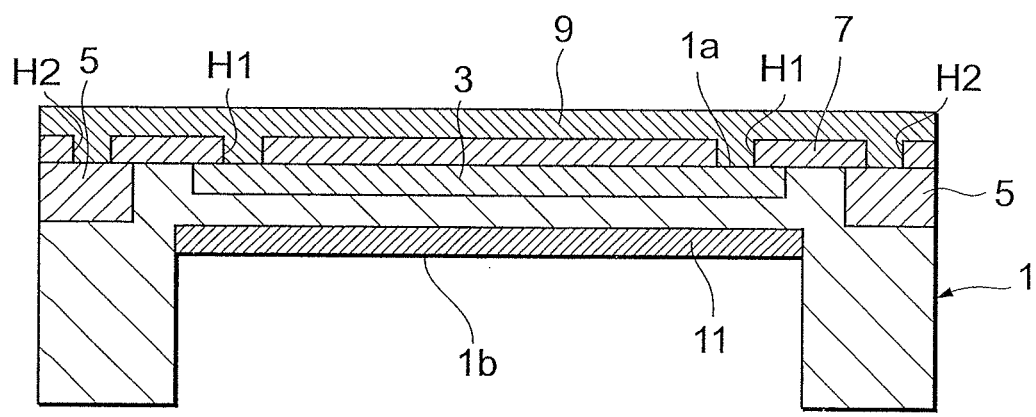
FIG. 22 is a drawing for explaining a manufacturing method of a photodiode according to the fourth embodiment.
Figure 23:
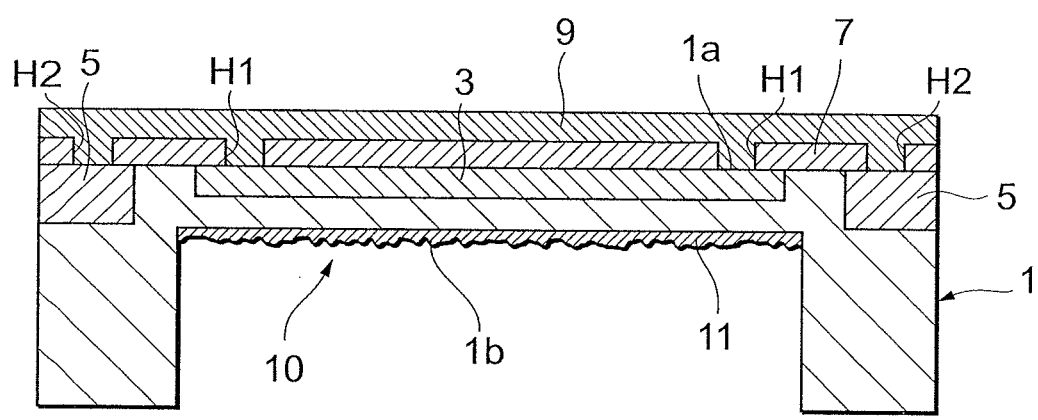
FIG. 23 is a drawing for explaining the manufacturing method of the photodiode according to the fourth embodiment.
Figure 24:
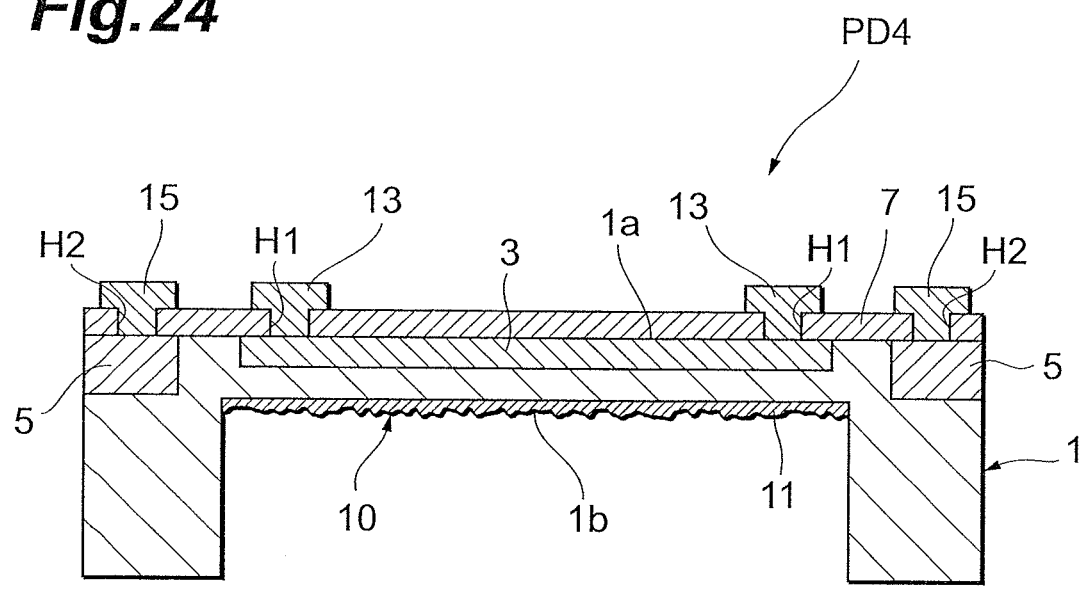
FIG. 24 is a drawing for explaining the manufacturing method of the photodiode according to the fourth embodiment.

A method for manufacturing a photodiode according to the fourth embodiment will be described with reference to FIGS. 22 to 24. FIGS. 22 to 24 are drawings for explaining the manufacturing method of the photodiode according to the fourth embodiment.

The manufacturing method of the fourth embodiment, up to the thinning of the n⁻ type semiconductor substrate 1, is the same as the manufacturing method of the third embodiment, and the description of the previous steps before it is omitted herein. After the n⁻ type semiconductor substrate 1 is polished from the second principal surface 1b side to obtain the n⁻ type semiconductor substrate 1 in the desired thickness, the accumulation layer 11 is formed on the second principal surface 1b side of the thinned portion of the n⁻ type semiconductor substrate 1 (cf. FIG. 22). The formation of the accumulation layer 11 is carried out in the same manner as in the first embodiment. The accumulation layer 11 has the thickness of, for example, about 3 μm.

Next, the second principal surface 1b of the n⁻ type semiconductor substrate 1 is irradiated with the pulsed laser beam PL to form the irregular asperity 10 (cf. FIG. 23). The formation of the irregular asperity 10 is carried out in the same manner as in the first embodiment.

Next, the n⁻ type semiconductor substrate 1 is subjected to a thermal treatment as in the first embodiment. Then the passivation layer 9 formed on the insulating layer 7 is removed and thereafter, the electrodes 13, 15 are formed (cf. FIG. 24). This completes the photodiode PD4.

In the fourth embodiment, as in the first to third embodiments, the travel distance of light incident into the photodiode PD4 also becomes long and the distance of absorption of light also becomes long. This allows the photodiode PD4 also to be improved in the spectral sensitivity characteristic in the near-infrared wavelength band.

In the fourth embodiment, prior to the formation of the accumulation layer 11, the portion corresponding to the p⁺ type semiconductor region 3 in the n⁻ type semiconductor substrate 1 is thinned from the second principal surface 1b side while leaving the surrounding region around the thinned portion. This permits the photodiode PD4 to be formed with respective light incident surfaces on the first principal surface 1a and the second principal surface 1b sides of the n⁻ type semiconductor substrate 1.

(Fifth Embodiment)

Figure 25:
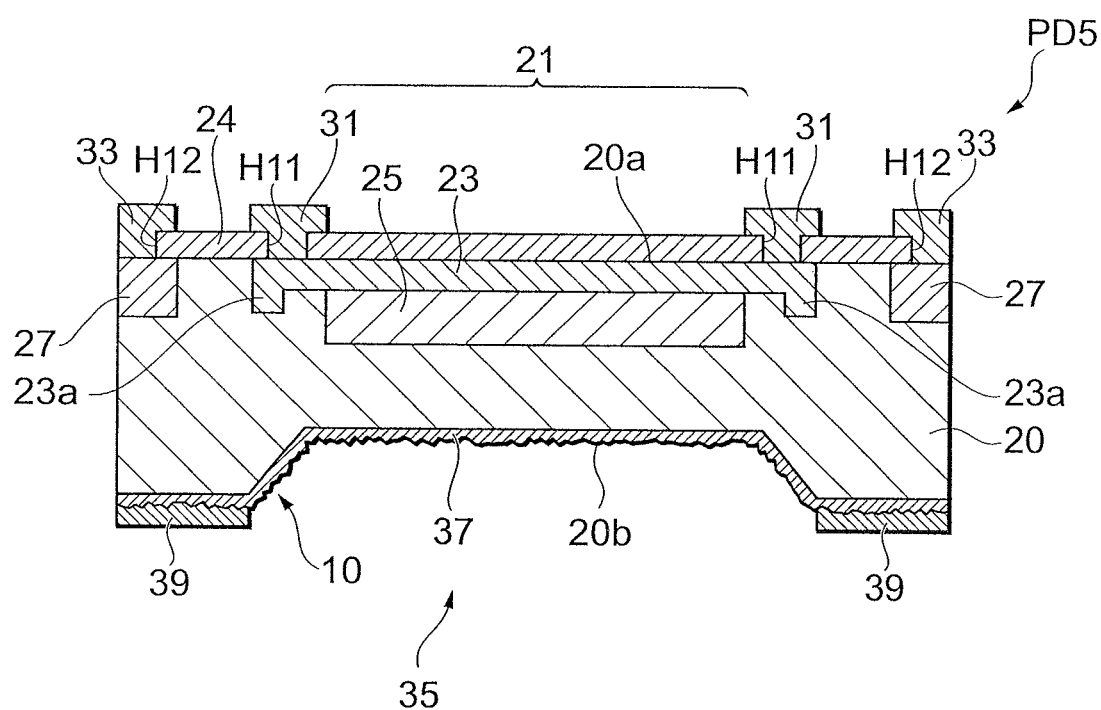
FIG. 25 is a drawing for explaining a configuration of a photodiode according to the fifth embodiment.

A photodiode PD5 according to the fifth embodiment will be described with reference to FIG. 25. FIG. 25 is a drawing for explaining a configuration of the photodiode of the fifth embodiment.

The photodiode PD5 is an avalanche photodiode for detecting low-energy light the wavelength region of which is in the visible to near infrared region. The photodiode PD5 is provided with a p⁻ type semiconductor substrate 20. The p⁻ type semiconductor substrate 20 is comprised of silicon (Si) crystal and has a first principal surface 20a and a second principal surface 20b opposed to each other. The p⁻ type semiconductor substrate 20 includes a photosensitive region 21.

The photosensitive region 21 is disposed in a central region of the first principal surface 20a on a plan view. The photosensitive region 21 has the thickness inward from the first principal surface 20a. The photosensitive region 21 is composed of an n⁺ type impurity region 23, a p⁺ type impurity region 25, and a region that is depleted with application of a bias voltage in the p⁻ type semiconductor substrate 20. The n⁺ type impurity region 23 has the thickness inside the p⁻ type semiconductor substrate 20 from the first principal surface 20a. The n⁺ type impurity region 23 has an n⁺ type guard ring 23a. The n⁺ type guard ring 23a is provided at the peripheral edge of the n⁺ type impurity region 23. The p⁺ type impurity region 25 has the thickness further inside the p⁻ type semiconductor substrate 20 from the n⁺ type impurity region 23. The p⁻ type semiconductor substrate 20 has a p⁺ type diffusion blocking region 27. The p⁺ type diffusion blocking region 27 is disposed at the peripheral edge of the first principal surface 20a on the plan view and has the thickness inward from the first principal surface 20a. The p⁺ type diffusion blocking region 27 is provided so as to surround the photosensitive region 21.

The p⁻ type semiconductor substrate 20 is a silicon substrate doped with a p-type impurity, e.g., such as boron (B). The p⁺ type impurity region 25 is a region doped with a p-type impurity in a higher concentration than the p⁻ type semiconductor substrate 20. The p⁺ type diffusion blocking region 27 is a region doped with a p-type impurity in a higher concentration than the p⁺ type impurity region 25. The n⁺ type impurity region 23 is a region doped with an n-type impurity, e.g., such as antimony (Sb). The n⁺ type impurity region 23 (including the n⁺ type guard ring 23a) and the p⁺ type impurity region 25 constitute a pn junction in the p⁻ type semiconductor substrate 20.

The photodiode PD5 has a passivation film 24 deposited on the first principal surface 20a. The photodiode PD5 has an electrode 31 and an electrode 33 disposed on the passivation film 24. In the passivation film 24, a contact hole H11 is provided on the n⁺ type impurity region 23 and a contact hole H12 is provided on the p⁺ type diffusion blocking region 27. The electrode 31 is in electrical contact with and connection to the n⁺ type impurity region 23 through the contact hole H11. The electrode 33 is in electrical contact with and connection to the p⁺ type diffusion blocking region 27 through the contact hole H12. A material of the passivation film 24 is, for example, silicon oxide or the like.

The photodiode PD5 has a recess 35 fanned on the second principal surface 20b side. The recess 35 is formed by thinning the p⁻ type semiconductor substrate 20 from the second principal surface 20b side and a thick frame portion exists around the recess 35. The side face of the recess 35 is inclined at an obtuse angle relative to the bottom face of the recess 35. The recess 35 is formed so as to overlap the photosensitive region 21 on the plan view. The thickness between the bottom face of the recess 35 and the first principal surface 20a is relatively small, e.g., about 100-200 μm, and is preferably about 150 μm. Since the thickness between the first principal surface 20a and the bottom face of the recess 35 is relatively small as described above, the response speed becomes higher and the bias voltage applied to the photodiode PD5 is reduced.

The irregular asperity 10 is formed throughout the entire second principal surface 20b of the p⁻ type semiconductor substrate 20. An accumulation layer 37 is formed on the second principal surface 20b side of the p⁻ type semiconductor substrate 20. In the accumulation layer 37, a region corresponding to the bottom face of the recess 35, i.e., the region opposed to the photosensitive region 21 forming the avalanche photodiode is optically exposed. That the second principal surface 20b is optically exposed embraces, not only the case where the second principal surface 20b is in contact with ambient gas such as air, but also the case where an optically transparent film is formed on the second principal surface 20b. The irregular asperity 10 may be formed only in the bottom face of the recess 35, i.e., only in the region opposed to the photosensitive region 21 functioning as the avalanche photodiode.

The photodiode PD5 has an electrode 39. The electrode 39 is provided on the accumulation layer 37 and is in electrical contact with and connection to the accumulation layer 37. The region where the electrode 39 is formed in the accumulation layer 37 is not optically exposed.

In the photodiode PD5 having the above configuration, when a reverse bias voltage (breakdown voltage) is applied to the electrode 31 and the electrode 39, carriers according to the quantity of light incident into the photosensitive region 21 are generated in the photosensitive region 21. The carriers generated near the $p^+$ type diffusion blocking region 27 flow into the $p^+$ type diffusion blocking region 27. For this reason, the $p^+$ type diffusion blocking region 27 reduces a tail in an output signal from the electrode 31.

The following will describe a method for manufacturing the photodiode PD5 of the fifth embodiment.

First, the $p^-$ type semiconductor substrate 20 is prepared. The thickness of the $p^-$ type semiconductor substrate 20 is about 300 μm.

Next, the $p^+$ type impurity region 25 and $p^+$ type diffusion blocking region 27 are formed on the first principal surface 20a side of the $p^-$ type semiconductor substrate 20. The $p^+$ type impurity region 25 is formed by ion implantation of a p-type impurity in a high concentration from the first principal surface 20a side in the $p^-$ type semiconductor substrate 20, using a mask opening in a central region. The $p^+$ type diffusion blocking region 27 is formed by diffusing a p-type impurity in a high concentration from the first principal surface 20a side in the $p^-$ type semiconductor substrate 20, using another mask opening in a peripheral region.

Next, the $n^+$ type guard ring 23a and the $n^+$ type impurity region 23 are formed on the first principal surface 20a side of the $p^-$ type semiconductor substrate 20. The $n^+$ type guard ring 23a is formed by diffusing an n-type impurity in a high concentration from the first principal surface 20a side in the $p^-$ type semiconductor substrate 20, using a mask opening in a ring shape. The $n^+$ type impurity region 23 is formed by ion implantation of an n-type impurity in a high concentration from the first principal surface 20a side in the $p^-$ type semiconductor substrate 20, using another mask opening in a central region.

Next, the surface of the second principal surface 20b of the $p^-$ type semiconductor substrate 20 is planarized by polishing. Thereafter, a portion corresponding to the $p^+$ type impurity region 25 in the $p^-$ type semiconductor substrate 20 is thinned from the second principal surface 20b side while leaving a surrounding region around the thinned portion. The thinning of the $p^-$ type semiconductor substrate 20 is carried out by anisotropic etching, e.g., alkali etching using a KOH aqueous solution, TMAH, or the like. The thickness of the thinned portion of the $p^-$ type semiconductor substrate 20 is, for example, about 150 μm and the thickness of the surrounding region is, for example, about 200 μm.

Next, the accumulation layer 37 is formed on the second principal surface 20b side of the $p^-$ type semiconductor substrate 20. Here, the accumulation layer 37 is formed by ion implantation of a p-type impurity in a higher impurity concentration than in the $p^-$ type semiconductor substrate 20, from the second principal surface 20b side in the $p^-$ type semiconductor substrate 20. The thickness of the accumulation layer 37 is, for example, about 1.5 μm.

Next, the $p^-$ type semiconductor substrate 20 is subjected to a thermal treatment (anneal). Here, the $p^-$ type semiconductor substrate 20 is heated in the temperature range of about 900 to 1100° C., more preferably about 1000° C., in an ambiance such as $N_2$ gas for about 0.5 to 1.0 hour, more preferably for about 0.5 hour. The thermal treatment restores the crystallinity of the $p^-$ type semiconductor substrate 20 and thus prevents the problem such as increase of dark current.

Next, the second principal surface 20b of the $p^-$ type semiconductor substrate 20 is irradiated with a pulsed laser beam PL to form the irregular asperity 10. The irregular asperity 10 is formed by irradiating the second principal surface 20b of the p type semiconductor substrate 20 with the pulsed laser beam, as in the aforementioned embodiments. A pulse laser generating device for the irradiation with the pulsed laser beam can be a picosecond to femtosecond pulse laser generating device. The irregular asperity 10 has facets intersecting with the direction perpendicular to the first principal surface 20a. The height difference of the asperity 10 is, for example, about 0.5-10 μm and the spacing of projections in the asperity 10 is about 0.5-10 μm. The picosecond to femtosecond pulsed laser beam has the pulse duration of, for example, about 50 fs-2 ps, the intensity of, for example, about 4-16 GW, and the pulse energy of, for example, about 200-800 μJ/pulse. More generally, the peak intensity is about $3\times10^{11}$ to $2.5\times10^{13}$ (W/cm$^2$) and the fluence about 0.1 to 1.3 (J/cm$^2$).

Next, the $p^-$ type semiconductor substrate 20 is subjected to a thermal treatment (anneal). Here, the $p^-$ type semiconductor substrate 20 is heated in the temperature range of about 900 to 1100° C., more preferably about 1000° C., in an ambiance such as $N_2$ gas, for about 0.5-1.0 hour, more preferably for about 0.5 hour. The thermal treatment achieves recovery from damage of disordered crystal and recrystallization thereof.

Next, the passivation film 24 is formed on the first principal surface 20a side of the $p^-$ type semiconductor substrate 20. Then the contact holes H11, H12 are formed in the passivation film 24 and the electrodes 31, 33 are formed. The electrode 31 is formed in the contact hole H11 and the electrode 33 in the contact hole H12. Furthermore, the electrode 39 is formed on the accumulation layer 37 in the surrounding region around the thinned portion of the $p^-$ type semiconductor substrate 20. The electrodes 31, 33 each are comprised of aluminum (Al) or the like and the electrode 39 is comprised of gold (Au) or the like. This completes the photodiode PD5.

In the photodiode PD5, the irregular asperity 10 is formed in the second principal surface 20b. For this reason, the light incident into the photodiode PD5 is reflected, scattered, or diffused by the asperity 10 to travel through a long distance in the $p^-$ type semiconductor substrate 20.

In the photodiode PD5, where the light is incident from the direction normal to a light incident surface (first principal surface 20a), when the light arrives at the irregular asperity 10 formed in the second principal surface 20b, light components arriving thereat at angles of not less than 16.6° relative to the direction of emergence from the asperity 10 are totally reflected by the asperity 10. Since the asperity 10 is formed irregularly, it has various angles relative to the emergence direction and diffuses the totally reflected light components into various directions. For this reason, the totally reflected light components include light components absorbed inside the $p^-$ type semiconductor substrate 20 and light components reaching the first principal surface 20a and side faces.

The light components reaching the first principal surface 20a and the side faces travel in various directions because of the diffusion at the asperity 10. For this reason, the light components reaching the first principal surface 20a and the side faces are extremely highly likely to be totally reflected by the first principal surface 20a and the side faces. The light components totally reflected by the first principal surface 20a and the side faces are repeatedly totally reflected on different faces, whereby the travel distance thereof further increases. Therefore, the light incident into the photodiode PD5 is absorbed by the p⁻ type semiconductor substrate 20 during the travel through the long distance inside the p⁻ type semiconductor substrate 20 to be detected as a photocurrent.

The light L incident into the photodiode PD5 mostly travels, without being transmitted by the photodiode PD5, through the long travel distance to be absorbed in the p⁻ type semiconductor substrate 20. Therefore, the photodiode PD5 is improved in the spectral sensitivity characteristic in the near-infrared wavelength band.

An experiment was conducted in order to check the improvement effect in the spectral sensitivity characteristic in the near-infrared wavelength band by the fifth embodiment.

We produced the photodiode having the above-described configuration (which is referred to as Example 2) and a photodiode without the irregular asperity in the second principal surface of the p⁻ type semiconductor substrate (which is referred to as Comparative Example 2) and checked the spectral sensitivity characteristics of the respective photodiodes. Example 2 and Comparative Example 2 have the same configuration except for the formation of the irregular asperity by irradiation with the pulsed laser light. The size of the p⁻ type semiconductor substrate 20 was set to 4.24 mm×4.24 mm. The size of the p⁺ type impurity region 25, i.e., the size of the photosensitive region was set to 3 mmφ. The bias voltage VR applied to the photodiodes was set to about 300 V.

Figure 26:
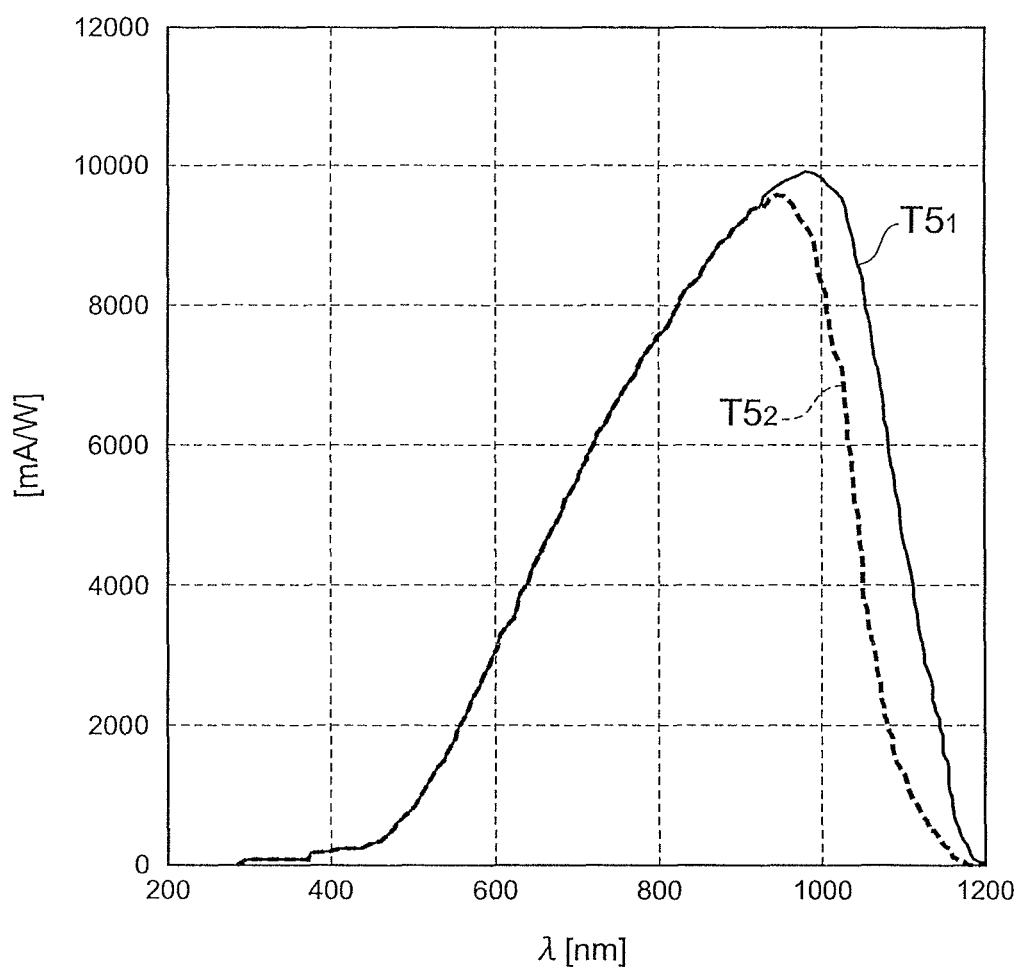
FIG. 26 is a diagram showing changes of spectral sensitivity versus wavelength in Example 2 and Comparative Example 2.

The results are provided in FIG. 26. In FIG. 26, the spectral sensitivity characteristic of Example 2 is indicated by $T5_1$ and the spectral sensitivity characteristic of Comparative Example 2 by characteristic $T5_2$. In FIG. 26, the vertical axis represents the spectral sensitivity (mA/W) and the horizontal axis the wavelength of light (nm). As seen from FIG. 26, for example at 1064 nm, the spectral sensitivity is 4.1 A/W in Comparative Example 2, whereas the spectral sensitivity is 7.6 A/W in Example 2, confirming that the spectral sensitivity is drastically improved in the near-infrared wavelength band.

In the photodiode PD5, the accumulation layer 37 is formed on the second principal surface 20b side of the p⁻ type semiconductor substrate 20. This induces recombination of unnecessary carriers generated independent of light on the second principal surface 20b side, so as to reduce the dark current. The accumulation layer 37 prevents carriers generated by light near the second principal surface 20b, from being trapped in the second principal surface 20b. For this reason, the carriers generated by light efficiently migrate to the pn junction, so as to further improve the photodetection sensitivity of the photodiode PD5.

In the fifth embodiment, the p⁻ type semiconductor substrate 20 is subjected to the thermal treatment, after formation of the accumulation layer 37. This restores the crystallinity of the p⁻ type semiconductor substrate 20, so as to prevent the problem such as increase of dark current.

The accumulation layer 37 may be formed after formation of the irregular asperity 10. In the case where the irregular asperity 10 is formed by irradiation with the pulsed laser light, after the formation of the accumulation layer 37, the thickness of the accumulation layer 37 is preferably set to be larger than the height difference of the irregular asperity 10. In this case, the accumulation layer 37 is certainly left even after the irregular asperity 10 is formed by irradiation with the pulsed laser light. The operational effect by the accumulation layer 37 can be ensured accordingly.

In the fifth embodiment, the electrodes 31, 33, 39 are formed after the thermal treatment of the p⁻ type semiconductor substrate 20. This prevents the electrodes 31, 33, 39 from melting during the thermal treatment, even if the electrodes 31, 33, 39 are made of materials with a relatively low melting point. Therefore, the electrodes 31, 33, 39 can be appropriately formed without being affected by the thermal treatment.

In the fifth embodiment, the irregular asperity 10 is formed by irradiation with the picosecond to femtosecond pulsed laser beam. This allows the irregular asperity 10 to be appropriately and readily formed.

In the fifth embodiment, the p⁻ type semiconductor substrate 20 is thinned from the second principal surface 20b side. This allows us to obtain the photodiode with the respective light incident surfaces on the first principal surface 20a side and the second principal surface 20b side of the p⁻ type semiconductor substrate 20. Namely, the photodiode PD5 can be used, not only as a front-illuminated type photodiode, but also as a back-thinned type photodiode.

We conducted an experiment for checking the improvement effect in the spectral sensitivity characteristic in the near-infrared wavelength band in the case where the photodiode PD5 of the fifth embodiment was used as a back-thinned type photodiode.

Figure 27:
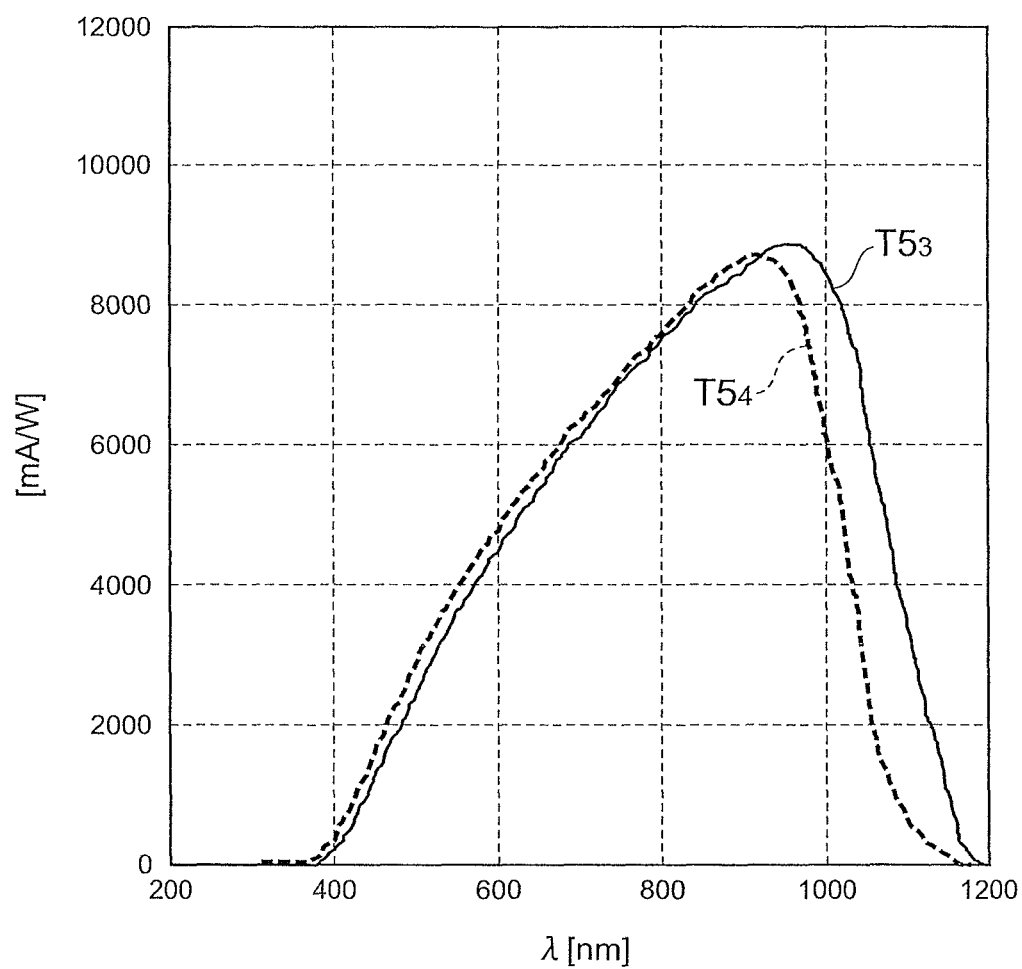
FIG. 27 is a diagram showing changes of spectral sensitivity versus wavelength in Example 2 and Comparative Example 2.

We checked the respective spectral sensitivity characteristics with incidence of light from the back surface, using the aforementioned photodiodes of Example 2 and Comparative Example 2. The results are provided in FIG. 27. In FIG. 27, the spectral sensitivity characteristic of Example 2 is indicated by $T5_3$ and the spectral sensitivity characteristic of Comparative Example 2 by characteristic $T5_4$. In FIG. 27, the vertical axis represents the spectral sensitivity (mA/W) and the horizontal axis the wavelength of light (nm). As seen from FIG. 27, for example at 1064 nm, the spectral sensitivity is 1.9 A/W in Comparative Example 2, whereas the spectral sensitivity is 5.7 A/W in Example 2, confirming that the spectral sensitivity is drastically improved in the near-infrared wavelength band.

As described above, the photodiode PD5 of the fifth embodiment has the sufficient spectral sensitivity at 1064 nm, regardless of whether it is used as the front-illuminated type or the back-thinned type. Therefore, the photodiode PD5 can be used as a device for detecting YAG laser light.

Incidentally, concerning the avalanche photodiode, it is possible to realize the avalanche photodiode with a practically sufficient spectral sensitivity characteristic in the near-infrared wavelength band, by setting the semiconductor substrate of silicon thick (e.g., about several hundred μm to 2 mm). However, the avalanche photodiode necessitates the bias voltage for depletion and the bias voltage for avalanche multiplication and, therefore, in the case where the thickness of the semiconductor substrate is set large, it becomes necessary to apply the extremely high bias voltage. Furthermore, the thick semiconductor substrate also increases the dark current.

In the photodiode PD5 of the fifth embodiment, however, since the irregular asperity 10 is formed in the second principal surface 20b as described above, the travel distance of the light incident into the photodiode PD5 is lengthened. For this reason, it is feasible to realize the photodiode with the practically sufficient spectral sensitivity characteristic in the near-infrared wavelength band, without need for increasing the thickness of the semiconductor substrate p⁻ type semiconductor substrate 20), particularly, the portion corresponding to the photosensitive region 21. Therefore, the foregoing photodiode PD5 can achieve the good spectral sensitivity characteristic with application of a lower bias voltage than the photodiode with the spectral sensitivity characteristic in the near-infrared wavelength band based on the increase in the thickness of the semiconductor substrate. In addition, the increase of dark current is suppressed, so as to improve the detection accuracy of the photodiode PD5. Furthermore, since the thickness of the p⁻ type semiconductor substrate 20 is small, the response speed of the photodiode PD5 improves.

Figure 28:
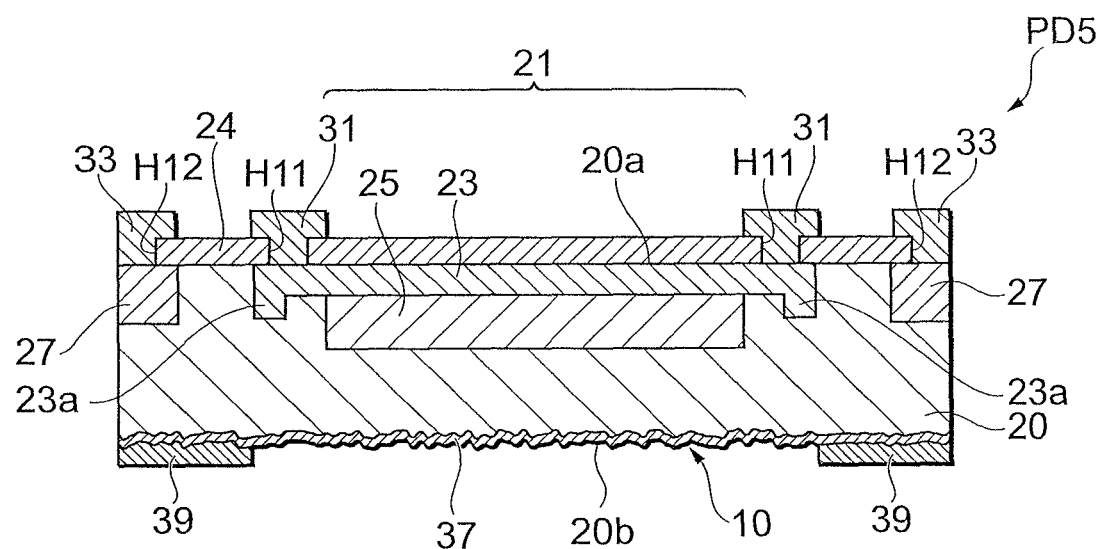
FIG. 28 is a drawing for explaining a configuration of a photodiode according to a modification example of the fifth embodiment.

In the photodiode PD5 of the fifth embodiment, the entire region on the second principal surface 20b side may be thinned as shown in FIG. 28.

(Sixth Embodiment)

Figure 29:
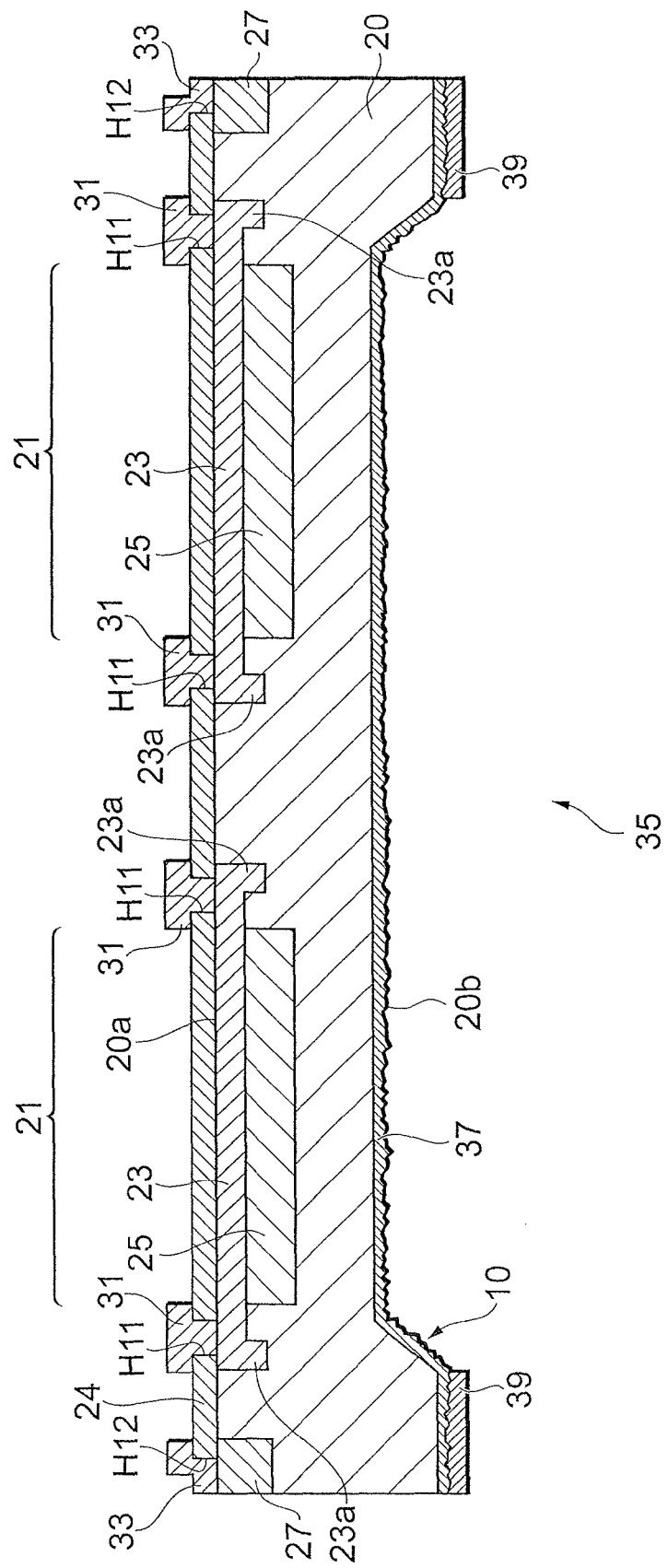
FIG. 29 is a drawing for explaining a configuration of a photodiode array according to the sixth embodiment.

A photodiode array PDA according to the sixth embodiment will be described with reference to FIG. 29. FIG. 29 is a drawing for explaining a cross-sectional configuration of the photodiode array according to the sixth embodiment.

The photodiode array PDA is provided with a p⁻ type semiconductor substrate 20, and a plurality of photosensitive regions 21 functioning as avalanche photodiodes are arranged on the p⁻ type semiconductor substrate 20.

The irregular asperity 10 is formed throughout the entire second principal surface 20b of the p⁻ type semiconductor substrate 20. Namely, the photodiode array PDA has the irregular asperity 10 formed not only in regions opposed to the photosensitive regions 21 functioning as avalanche photodiodes, but also in regions opposed to the regions between the photosensitive regions 21.

In the sixth embodiment, as in the fifth embodiment, the travel distance of light incident into the photodiode array PDA also becomes long and the distance of absorption of light also becomes long. This allows the photodiode array PDA also to be improved in the spectral sensitivity characteristic in the near-infrared wavelength band.

The photodiode array PDA of the sixth embodiment, like the fifth embodiment, can achieve the good spectral sensitivity characteristic with application of a lower bias voltage than a photodiode array with a practically sufficient spectral sensitivity characteristic in the near-infrared wavelength band based on the increase in the thickness of the semiconductor substrate. In addition, the increase of dark current is suppressed, so as to improve the detection accuracy of the photodiode array PDA. Furthermore, since the thickness of the p⁻ type semiconductor substrate 20 is small, the response speed of the photodiode array PDA improves.

Figure 30:
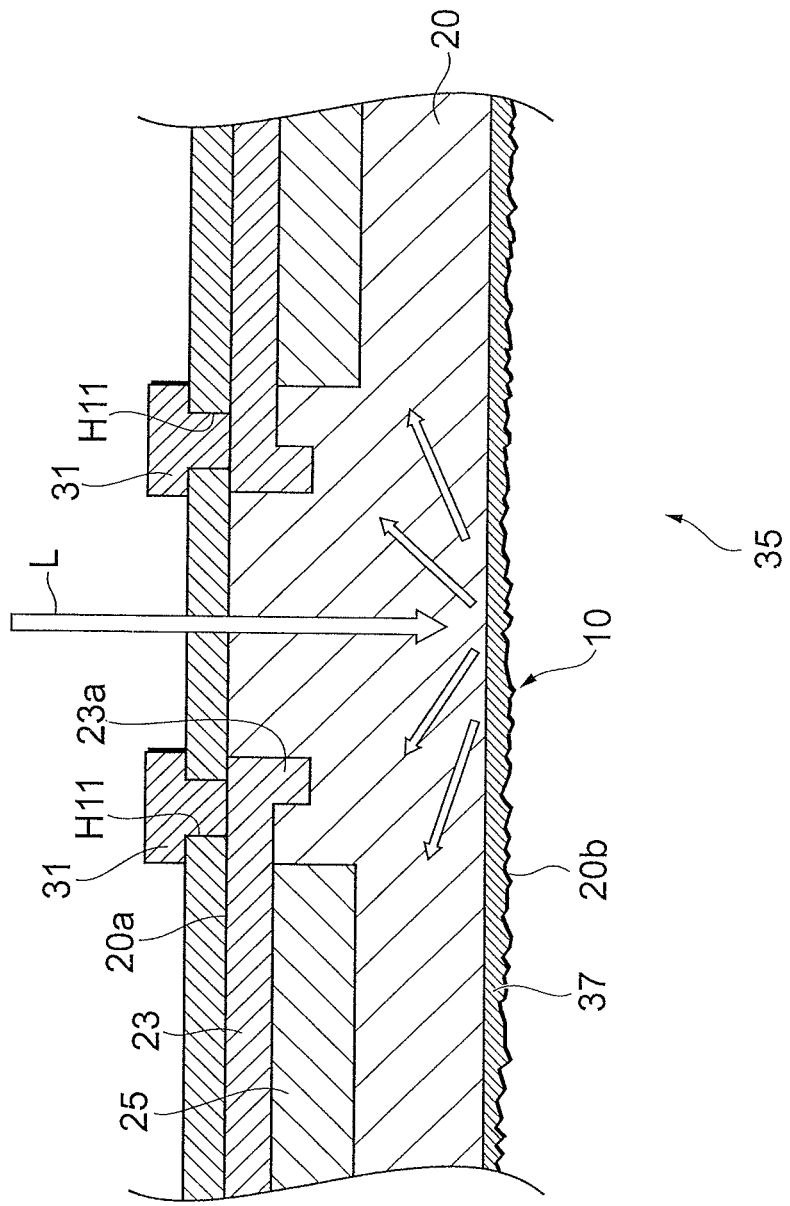
FIG. 30 is a drawing for explaining a configuration of the photodiode array according to the sixth embodiment.

In the photodiode array PDA, the irregular asperity 10 is also formed in the regions opposed to the regions between the photosensitive regions 21 in the second principal surface 20b of the p⁻ type semiconductor substrate 20. For this reason, light L incident between the photosensitive regions 21 is reflected, scattered, or diffused by the irregular asperity 10 formed in the regions opposed to the regions between the photosensitive regions 21 in the second principal surface 20b, as shown in FIG. 30, to be absorbed by any one of the photosensitive regions 21. In the photodiode array PDA, therefore, the detection sensitivity is not lowered between the photosensitive regions 21, so as to improve the detection sensitivity.

The photodiode array PDA can also be used as a device for detecting YAG laser light as the photodiode PD5 of the fifth embodiment.

In the photodiode array PDA the entire region on the second principal surface 20b side may be thinned as in the case of the photodiode PD5 of the fifth embodiment. The photodiode array PDA can be used as a photodiode array of either of the front-illuminated type and the back-thinned type.

The above described the preferred embodiments of the present invention, but it should be noted that the present invention is not always limited to the above-described embodiments and that the present invention can be modified in many ways without departing from the spirit and scope of the invention.

In the first to fourth embodiments the irregular asperity 10 is formed by irradiating the entire area of the second principal surface 1b with the pulsed laser beam, but it is not limited only to this example. For example, the irregular asperity 10 may be formed, for example, by irradiating only a region opposed to the p⁺ type semiconductor region 3 in the second principal surface 1b of the n⁻ type semiconductor substrate 1 with the pulsed laser beam. In the fifth and sixth embodiments the irregular asperity 10 may also be formed by irradiating only the region opposed to each photosensitive region 21 with the pulsed laser beam.

In the first to fourth embodiments the electrode 15 is in electrical contact with and connection to the n⁺ type semiconductor region 5 formed on the first principal surface 1a side of the n⁻ type semiconductor substrate 1, but it is not limited only to this example. For example, the electrode 15 may be in electrical contact with and connection to the accumulation layer 11 formed on the second principal surface 1b side of the n⁻ type semiconductor substrate 1. In this case, the electrode 15 is preferably formed outside the region opposed to the p⁺ type semiconductor region 3 in the second principal surface 1b of the n⁻ type semiconductor substrate 1. The reason for it is as follows: if the electrode 15 is formed in the region opposed to the p⁺ type semiconductor region 3 in the second principal surface 1b of the n⁻ type semiconductor substrate 1, the irregular asperity 10 formed in the second principal surface 1b is blocked by the electrode 15, causing an event of reduction in the spectral sensitivity in the near-infrared wavelength band. The above-described matter also applies to the fifth and sixth embodiments.

The conductivity types of p type and n type in the photodiodes PD1-PD5 and the photodiode array PDA in the embodiments may be interchanged so as to be reverse to those described above.

INDUSTRIAL APPLICABILITY

The present invention is applicable to semiconductor photodetection elements and photodetection apparatus.

LIST REFERENCE SIGNS 1 n⁻ type semiconductor substrate; 1a first principal surface; 1b second principal surface; 3 p⁺ type semiconductor region; 5 n⁺ type semiconductor region; 10 irregular asperity; 11 accumulation layer; 13, 15 electrodes; 20 p⁻ type semiconductor substrate; 20a first principal surface; 20b second principal surface; 21 photosensitive region; 23 n⁺ type impurity region; 25 p⁺ type impurity region; 37 accumulation layer; PL pulsed laser beam; PD1-PD5 photodiodes; PDA photodiode array.

The invention claimed is:

1. A photodiode comprising:
a silicon substrate comprised of a semiconductor of a first conductivity type and having a first principal surface and a second principal surface opposed to each other, wherein an avalanche photodiode composed of a pn junction between a semiconductor region of the first conductivity type having a higher impurity concentration than the silicon substrate and a semiconductor region of a second conductivity type is arranged on the first principal surface side of the silicon substrate, wherein on the second principal surface side of the silicon substrate, an accumulation layer of the first conductivity type having a higher impurity concentration than the silicon substrate is formed and an irregular asperity is formed in at least a region opposed to the avalanche photodiode, wherein the region opposed to the avalanche photodiode in the second principal surface of the silicon substrate is optically exposed, and wherein the second principal surface where the irregular asperity is formed in at least the region opposed to the avalanche photodiode constitutes a light incident surface, light incident from the second principal surface travels in the silicon substrate, the photodiode being a back-illuminated type.

2. The photodiode according to claim 1, wherein in the silicon substrate, a portion corresponding to the semiconductor region of the second conductivity type is thinned from the second principal surface side while leaving a surrounding region around said thinned portion.

3. The photodiode according to claim 1, wherein a thickness of the accumulation layer of the first conductivity type is larger than a height difference of the irregular asperity.

4. The photodiode according to claim 1, wherein the light incident from the second principal surface and traveling in the silicon substrate is reflected, scattered, or diffused by the irregular asperity.

5. The photodiode according to claim 1, wherein the irregular asperity is formed by applying pulsed laser beam.

* * * * *